(12) United States Patent
Seong et al.

(10) Patent No.: US 7,508,709 B2
(45) Date of Patent: Mar. 24, 2009

(54) PAGE BUFFER CIRCUIT WITH REDUCED SIZE AND METHODS FOR READING AND PROGRAMMING DATA WITH THE SAME

(75) Inventors: Jin Yong Seong, Seoul (KR); Sam Kyu Won, Kyeongki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 418 days.

(21) Appl. No.: 11/304,526

(22) Filed: Dec. 14, 2005

(65) Prior Publication Data
US 2007/0019468 A1    Jan. 25, 2007

(30) Foreign Application Priority Data
Jul. 19, 2005    (KR)    .................. 10-2005-0065208

(51) Int. Cl.
*G11C 11/34*    (2006.01)
*G11C 16/04*    (2006.01)

(52) U.S. Cl. .............................. 365/185.12; 365/185.03
(58) Field of Classification Search ............ 365/185.12, 365/185.03
See application file for complete search history.

(56) References Cited

U.S. PATENT DOCUMENTS 7,187,584 B2 *    3/2007    Chang .................. 365/185.17

\* cited by examiner

*Primary Examiner*—Huan Hoang
*Assistant Examiner*—Kretelia Graham
(74) *Attorney, Agent, or Firm*—Townsend and Townsend and Crew LLP

(57) ABSTRACT

A page buffer circuit with reduced size and methods for reading and programming data is provided. In the reading operation, the page buffer circuit reads out a data bit by alternatively using a higher bit register or a lower bit register regardless of whether the data bit read from the multi-level cell is a higher bit or a lower bit, thereby reducing the circuit area and improves the performance of operation.

9 Claims, 16 Drawing Sheets

PAGE BUFFER CIRCUIT WITH REDUCED SIZE AND METHODS FOR READING AND PROGRAMMING DATA WITH THE SAME

BACKGROUND

The present invention relates to flash memory devices and more particularly, to a page buffer circuit of a flash memory device and a method for reading and programming data using the page buffer circuit therein.

In general, reading and programming operations in a flash memory device are executed in the unit of page. It is recently proposed a flash memory device including multi-level cells (MLC) that stores pluralities of data bits with the purpose of improving the integration density thereof. As a multi-level cell is able to be programmed with two data bits, it can store one among four data states, i.e., [11], [10], [00], and [01], and is set with one of threshold voltages Vt1~Vt4 corresponding to the stored data states. Otherwise, a memory cell storing a single data bit is referred to as a single-level cell (SLC).

FIG. 1 is a schematic diagram showing a conventional page buffer circuit of a flash memory device with inputs/outputs to carry out reading and programming operations for the multi-level cell. As shown in FIG. 1, the page buffer circuit 10 includes a bitline selection circuit 11, a precharging circuit 12, a higher-bit register circuit 13, a lower-bit register circuit 14, a data comparing circuit 15, data transmission circuits 16 and 17, a data input circuit 18, and a data output circuit 19. The data input circuit 18 includes NMOS transistors 25 and 26 while the data output circuit 19 includes NMOS transistors 27 and 28. A procedure of reading out a data bit from a multi-level cell (not shown) by the page buffer circuit 10 is as follows in brief.

As an example, it will be explained about the procedure of reading out a lower data bit from the multi-level cell connected to one of bitlines BLe and BLo. The higher and lower bit registers, 13 and 14, are initialized and the precharging circuit 12 charges a sensing node S up to the level of a power source voltage Vcc in advance. Thereafter, the bitline selection circuit 11 connects one of the bitlines BLe and BLo, e.g., BLe, to the sensing node S. And, a read voltage is supplied to a gate of the multi-level cell, which is connected to the bitline BLe, by way of a wordline (not shown). As a result, the bitline BLe and the sensing node S are maintained on the level of the power source voltage Vcc or discharged into the level of a ground voltage in accordance with a data value stored in the multi-level cell that is connected to the bitline BLe. At this time, the lower-bit register 14 detects a voltage at the sensing node S in response to a latch control signal LATCH1 or LATCH2 and stores the detected data bit as a lower data bit therein. The lower data bit stored in the lower-bit register 14 is output to an input/output node Y by the NMOS transistor 28 of the data output circuit 19.

On the other hand, a procedure of reading a higher data bit from a multi-level cell connected to one of the bitlines BLe and BLo is similar to the procedure of reading the lower data bit, but with several points of difference. A first difference between the procedures of reading the higher and lower data bits is that read voltage levels are different from each other. A second difference is that the higher data bit read out from the multi-level cell is output to the data input/output node Y through the NMOS transistor 27 of the data output circuit 19 after being stored in the higher-bit register 13 operating in response to the latch control signal MLATCH1. As such, in the page buffer circuit 10, the lower data bit is stored only in the lower-bit register 14 and the higher data bit is stored only in the higher-bit register 13. This is because the higher-bit register 13 is configured to just detect a voltage of the sensing node S making it impossible to store the inverse value of the detected data bit therein. Thus, the page buffer circuit 10 is inefficient in that point of view. Further, the data output circuit 19 needs to include the NMOS transistor 28 to output the lower data bit to the data input/output node Y, and the NMOS transistor 27 to output the higher data bit to the data input/output node Y.

Next, a procedure of programming a multi-level cell connected to one of the bitlines BLe and BLo by the page buffer circuit 10 is as follows. First, after initializing the higher-bit register 13 and the lower-bit register 14, a data bit to be programmed is stored in the higher-bit register 13. Thereafter, the data bit stored in the higher-bit register 13 is transferred to the higher-bit register 14 by the data transmission circuit 16 and then stored in the lower-bit register 14. One of the bitlines BLe and BLo, e.g., BLe, is connected to the sensing node S by the bitline selection circuit 11. Also, a program voltage is supplied to a gate of the multi-level cell, which is connected to the bitline BLe, by way of a wordline. The data transmission circuit 17 transfers the data bit from the lower-bit register 14 to the sensing node S. As a result, the data bit stored in the lower-bit register 14 is transferred to the bitline BLe connected to the sensing node S and thereby the multi-level cell connected to the bitline BLe is programmed with the transferred data bit. Through the aforementioned procedure, a programming operation for the lower data bit is completed.

In a procedure of programming a higher data bit in the multi-level cell, the higher-bit register 13 and the lower-bit register 14 are first initialized and a data bit to be programmed is stored in the higher-bit register 13. The lower-bit register 14 stores a lower data bit read out from the multi-level cell. Thereafter, the data bit stored in the higher-bit register 13 is transferred to the lower-bit register 14 and then stored therein. The bitline selection circuit 11 connects one of the bitlines BLe and BLo, e.g., BLe, to the sensing node S. Also, a program voltage is supplied to the gate of the multi-level cell, which is connected to the selected bitline BLe, by way of a wordline. The data comparing circuit 15 compares the data bit of the higher-bit register 13 with the data bit of the lower-bit register 14, and then outputs a compared result therefrom to the sensing node S. The resultant data bit by the comparison is stored in the higher-bit register 13. Thereafter, the data comparing circuit 15 compares the data bit of the higher-bit register 13 with the data bit of the lower-bit register 14 again, and then outputs a data bit, which is to be programmed to the sensing node S. As a result, the program data bit is transferred to the bitline BLe that is connected to the sensing node S, so that the multi-level cell connected to the selected bitline BLe is programmed. Through the aforementioned procedure, the programming operation for the multi-level cell connected to the bitline BLe is completed.

As stated above, the page buffer circuit shown in FIG. 1 requires the data comparing circuit 15 to program the higher data bit after programming the lower data bit in the multi-level cell. As a result, as the page buffer circuit 10 includes the NMOS transistors, 27 and 28, of the data output circuit 19, as well as the data comparing circuit 15, it raises the circuit area and increases the size of the flash memory device.

SUMMARY OF THE INVENTION

The present invention is directed to a page buffer circuit capable of reducing the circuit area and enhancing the performance of operation.

The present invention is also directed to a method for reading a data bit from a multi-bit cell with a page buffer circuit, capable of reducing the circuit area and enhancing the performance of operation.

The present invention is also directed to a method for programming a data bit in a multi-bit cell with a page buffer circuit, capable of reducing the circuit area and enhancing the performance of operation.

The page buffer circuit according to the present invention is configured to conduct reading and programming operations for a multi-level cell with a simplified circuit structure. The page buffer circuit according to the present invention is configured to read out a data bit, regardless of whether the data bit from the multi-level cell is a higher data bit or a lower data bit, by alternatively utilizing higher-bit and lower-bit registers in a reading operation.

An aspect of the present invention is to provide a page buffer circuit of a flash memory device including pluralities of multi-level cells, each being connected to at least one pair of bitlines, comprising: a higher-bit register detecting a voltage of a sensing node and storing a first or second higher sensing data bit according to a result of the detection, in response to a first or second read-control signal, and storing a first or second internal data bit in response to the first or second higher read-control signal and an input data bit received through an input/output node; an output drive circuit generating an output data bit in response to a received signal from among the first higher sensing data bit, the second higher sensing data bit, the first internal data bit, and the second internal data bit; a lower-bit register detecting a voltage of the sensing node and storing a first or second lower sensing data bit according to a result of the detecting, in response to a first or second lower read-control signal; a first transmission transferring the output data bit to the sensing node in response to a first program control signal; and a second transmission transferring the first or second lower sensing data bit to the sensing node in response to a second program control signal.

In this embodiment, the page buffer circuit further comprises: a data input circuit outputting the input data bit to the input/output node in response to an input control signal; a data output circuit outputting the output data bit to an data input/output node in response to an output control signal; a bitline selection circuit designating one of the bitline pair and connecting the selected bitline with the sensing node, in response to bitline selection signals and discharge signals; a precharge circuit precharging the sensing node to an internal voltage in response to a precharge control signal; a first verifying circuit outputting a higher verifying data bit in response to a received one of the first and second higher sensing data bits; and a second verifying circuit outputting a lower verifying data bit in response to a received one of the first and second lower sensing data bits.

In this embodiment, the higher-bit register comprises: a sensing circuit detecting a voltage of the sensing node and generating a sensing data bit to the input/output node according to a result of the detection; an input circuit outputting the first higher sensing data bit or the first internal data bit to a first node in response to the first higher read-control signal and the sensing data bit or the input data bit which is received through the input/output node, or outputting the second higher sensing data bit or the second internal data bit to a second node in response to the second higher read-control signal and the sensing data bit or the input data bit which is received through the input/output node; and a latch circuit latching the first internal data bit or the first higher sensing data bit received through the first node and outputting an inverse of the first higher sensing data bit or an inverse of the first internal data bit to the second node, or latching the second internal data bit or the second higher sensing data bit received through the second node and outputting an inverse of the second higher sensing data bit or an inverse of the second internal data bit to the first node.

In this embodiment, the sensing circuit discharges the input/output node to a ground voltage level in accordance with a voltage level of the sensing node. The input circuit comprises: a first switching circuit connected between the first node and the input/output node, which is turned on or off in response to the first higher read-control signal; and a second switching circuit connected between the second node and the input/output node, which is turned on or off in response to the second higher read-control signal.

In this embodiment, the output drive circuit comprises a first inverter that inverses one (which is received through the first node) among the first higher sensing data bit, the inverse of the second higher sensing data bit, the first internal data bit, and the inverse of the second internal data bit.

The latch circuit comprises second inverters cross-coupled with input and output terminals to the first and second nodes.

The first inverter is larger than each of the second inverters in current drivability.

In this embodiment, during a read operation, the sensing circuit detects a voltage of the sensing node which is determined by a higher or lower data bit read out from one of the plural multi-level cells connected to the selected bitline or by the first or second lower sensing data bit.

In this embodiment, the lower-bit register a sensing circuit detecting a voltage of the sensing node and generating the first lower sensing data bit to a first node, in response to the first lower read-control signal, or detecting a voltage of the sensing node and generating the second lower sensing data bit to a second node, in response to the second lower read-control signal; and a latch circuit latching the first lower sensing data bits received through the first node and outputting an inverse of the first lower sensing data bit to the second node, or latching the second lower sensing data bits received through the second node and outputting an inverse of the second lower sensing data bit to the first node.

In this embodiment, the sensing circuit detects a voltage of the sensing node which is determined by a lower or higher data bit read out from one of the plural multi-level cells connected to the selected bitline, during a read operation, and detects a voltage of the sensing node which is determined by the lower data bit or the output data bit.

In this embodiment, the data input circuit comprises a first switching circuit connected between the input/output node and the data input/output node, which is turned on or off in response to the input control signal.

The data output circuit comprises a second switching circuit connected between an output terminal of the output drive circuit and the data input/output node, which is turned on or off in response to the output control signal.

The present invention also provides a method for reading a data bit by a page buffer circuit connected to at least a pair of bitlines in a flash memory device having pluralities of wordlines and pluralities of multi-level cells each being connected to the bitline pair. The method comprises the steps of: initializing a higher-bit register and a lower-bit register; selecting one of the bitlines forming the bitline pair and connecting the selected bitline to a sensing node, in response to bitline selection signals and discharge signals; selecting one of the higher-bit register and the lower-bit register as a read register when one of the plural wordlines is selected; reading a lower data bit from a selected multi-level cell, among the plural multi-level cell, connected to the selected bitline and the selected wordline, by means of the higher-bit register when the higher-bit register is selected as the read register; and reading a lower data bit from the selected multi-level cell by means of the lower-bit register when the lower-bit register is selected as the read register.

In this embodiment, the step of reading the lower data bit by the higher-bit register comprises the steps of: detecting a voltage of the sensing node which is determined by a first read data bit output from the selected multi-level cell and storing a first higher sensing data bit into the higher-bit register in accordance with a result of the detection, in response to a first higher read-control signal, when a first read voltage is being supplied to the selected wordline; detecting a voltage of the sensing node which is determined by a second read data bit output from the selected multi-level cell and storing a second higher sensing data bit into the higher-bit register in accordance with a result of the detection, in response to a second higher read-control signal, when a second read voltage is being supplied to the selected wordline; inversing the second higher sensing data bit and outputting the inverse of the second higher sensing data bit; and outputting the inverse of the second higher sensing data bit to a data input/output node as the lower data bit in response to an output control signal. A logical value of the second higher sensing data bit is identical to or different from a logical value of the first higher sensing data bit.

In this embodiment, the second read voltage is higher than the first read voltage. The step of initializing the higher-bit register and the lower-bit register initializes the higher-bit register in response to the second higher read-control signal.

In this embodiment, the step of reading the lower data bit by the lower-bit register comprises the steps of: detecting a voltage of the sensing node, which is determined by a first read data bit output from the selected multi-level cell and storing a first lower sensing data bit into the lower-bit register in accordance with a result of the detection, in response to a first lower read-control signal, when a first read voltage is being supplied to the selected wordline; detecting a voltage of the sensing node which is determined by a second read data bit output from the selected multi-level cell and storing a second lower sensing data bit into the lower-bit register in accordance with a result of the detection, in response to a second lower read-control signal, when a second read voltage is being supplied to the selected wordline; transferring the second lower sensing data bit from the lower-bit register to the higher-bit register through the sensing node in response to a program control signal; detecting a voltage of the sensing node which is determined by the second lower sensing data bit and storing a higher sensing data bit into the higher-bit register in accordance with a result of the detection, in response to a first higher read-control signal; inversing the higher sensing data bit and outputting the inverse of the higher sensing data bit; and outputting the inverse of the higher sensing data bit to a data input/output node as the lower data bit in response to an output control signal. A logical value of the second lower sensing data bit is identical to or different from a logical value of the first lower sensing data bit.

In this embodiment, the second read voltage is higher than the first read voltage.

In this embodiment, the step of initializing the higher-bit register and the lower-bit register initializes the higher-bit register in response to the second higher read-control signal and initializes the lower-bit register in response to the second lower read-control signal.

The present invention also provides a method for reading a data bit by a page buffer circuit connected at least to a pair of bitlines in a flash memory device having pluralities of wordlines pluralities of multi-level cells each being connected to the bitline pair. The method comprises the steps of: initializing a higher-bit register and a lower-bit register; selecting one of the bitlines forming the bitline pair and connecting the selected bitline to a sensing node, in response to bitline selection signals and discharge signals; selecting one of the higher-bit register and the lower-bit register as a read register when one of the plural wordlines is selected; reading a higher data bit from a selected multi-level cell, among the plural multi-level cells, connected to the selected bitline and the selected wordline, by means of the higher-bit register when the higher-bit register is selected as the read register; and reading a higher data bit from the selected multi-level cell by means of the lower-bit register when the lower-bit register is selected as the read register.

In this embodiment, the step of reading the higher data bit by the higher-bit register comprises the steps of: detecting a voltage of the sensing node which is determined by a read data bit output from the selected multi-level cell and storing a higher sensing data bit into the higher-bit register in accordance with a result of the detection, in response to a first higher read-control signal, when a read voltage is being supplied to the selected wordline; inversing the higher sensing data bit and outputting the inverse of the higher sensing data bit; and outputting the inverse of the higher sensing data bit to a data input/output node as the higher data bit in response to an output control signal.

In this embodiment, the step of initializing the higher-bit register and the lower-bit register initializes the higher-bit register in response to a second higher read-control signal.

In this embodiment, the step of reading the lower data bit by the lower-bit register comprises the steps of: detecting a voltage of the sensing node which is determined by a read data bit output from the selected multi-level cell and storing a first lower sensing data bit into the lower-bit register in accordance with a result of the detection, in response to a first lower read-control signal, when a read voltage is being supplied to the selected wordline; transferring the lower sensing data bit from the lower-bit register to the higher-bit register through the sensing node in response to a program control signal; detecting a voltage of the sensing node which is determined by the lower sensing data bit and storing a higher sensing data bit into the higher-bit register in accordance with a result of the detection, in response to a first higher read-control signal; inversing the higher sensing data bit and outputting the inverse of the higher sensing data bit; and outputting the inverse of the higher sensing data bit to a data input/output node as the higher data bit in response to an output control signal.

In this embodiment, the step of initializing the higher-bit register and the lower-bit register initializes the higher-bit register in response to the second higher read-control signal and initializes the lower-bit register in response to the second lower read-control signal.

The present invention also provides a method for programming a data bit by a page buffer circuit connected to at least a pair of bitlines in a flash memory device having pluralities of wordlines and pluralities of multi-level cells each being connected to the bitline pair. The method comprises the steps of: initializing a higher-bit register and a lower-bit register; storing a first or second internal data bit into the higher-bit register in response to a first or second higher read-control signal and an input data bit received through an input/output node; transferring the first or second internal data bit from the higher-bit register to the lower-bit register through a sensing node in response to a first program control signal; detecting a voltage of the sensing node which is determined by the first or second internal data bit and storing a first lower sensing data bit into the lower-bit register in accordance with a result of the detection, in response to a first lower read-control signal; reading a lower data bit from a selected one among the plural multi-level cells, which is connected to a selected one of the plural wordlines and a selected one of the bitlines forming the bitline pair; detecting a voltage of the sensing node which is determined by the lower data bit and storing a second lower sensing data bit into the lower-bit register in accordance with a result of the detection, in response to the first lower read-control signal; generating a lower verifying data bit in response to the second lower sensing data bit and determining whether a logical value of the lower verifying data bit is an established value; outputting the second lower sensing data bit to the selected bitline through the sensing node in response to a second program control signal, while a program voltage is being supplied to the selected wordline, when the logical value of the lower verifying data bit is different from the established value, programming the second lower sensing data bit into the selected multi-level cell; and repeating the steps of reading, storing the second lower sensing data bit, determining, and outputting until the logical value of the lower verifying data bit reaches the established value.

In this embodiment, the step of initializing the higher-bit register and the lower-bit register initializes the higher-bit register in response to the first higher read-control signal and initializes the lower-bit register in response to the second lower read-control signal.

In this embodiment, a program voltage raised by a stepping voltage is supplied to the selected wordline every prosecution of the outputting step in programming cycles carried out after a first programming cycle including the steps of reading, storing the second lower sensing data bit, determining, and outputting.

The present invention also provides a method for programming a data bit by a page buffer circuit connected at least to a pair of bitlines in a flash memory device having pluralities of wordlines pluralities of multi-level cells each being connected to the bitline pair. The method comprises the steps of: initializing a higher-bit register and a lower-bit register; storing a first or second internal data bit into the higher-bit register in response to a first or second higher read-control signal and an input data bit received through an input/output node; storing a first lower sensing data bit into the lower-bit register with reference to the first or second internal data bit and a first lower data bit read out from a selected one among the plural multi-level cells, which is connected to a selected one of the bitlines forming the bitline pair and a selected one of the plural wordlines; generating a first higher verifying data bit and first verifying whether a logical value of the first higher verifying data bit is equal to an established value, in response to the first or second internal data bit; first, outputting the first or second internal data bit to the selected bitline through the sensing node in response to the first program control signal, while a program voltage is being supplied to the selected wordline, when the logical value of the first higher verifying data bit is different from the established value, programming the first or second internal data bit into the selected multi-level cell; generating a second higher verifying data bit and second verifying whether a logical value of the second higher verifying data bit is equal to the established value, in response to a higher data bit read out from the selected multi-level cell, when the first verifying voltage is being supplied to the selected wordline; second, outputting the higher data bit to the selected bitline through the sensing node in response to the first program control signal, while a program voltage is being supplied to the selected wordline, when the logical value of the second higher verifying data bit is different from the established value, programming the higher data bit into the selected multi-level cell; repeating the second verifying and outputting steps until the logical value of the second higher verifying data bit reaches the established value; generating a lower verifying data bit and third verifying whether a logical value of the lower verifying data bit is an established value, in response to a second lower data bit read out from the selected multi-level cell, while a second verifying voltage is being supplied to the selected wordline, when the logical value of the second higher verifying data bit is equal to the established value; third, outputting the second lower data bit to the selected bitline through the sensing node in response to a second program control signal, while a program voltage is being supplied to the selected wordline, when the logical value of the lower verifying data bit is different from the established value, programming the second lower data bit into the selected multi-level cell; and repeating the third verifying and outputting steps until the logical value of the lower verifying data bit reaches the established value.

In this embodiment, the step of storing the first lower sensing data bit into the lower-bit register comprises the steps of: detecting a voltage of the sensing node which is determined by the first lower data bit output from the selected multi-level cell and storing a first sensing data bit into the lower-bit register in accordance with a result of the detection, in response to a first lower read-control signal, when a read voltage is being supplied to the selected wordline; transferring the first or second internal data bit from the higher-bit register to the lower-bit register through the sensing node in response to the first program control signal; and detecting a voltage of the sensing node which is determined by the first or second internal data bit and storing a second sensing data bit into the lower-bit register in accordance with a result of the detection, in response to a first lower read-control signal. A logical value of the second sensing data bit is identical to or different from a logical value of the first sensing data bit.

In this embodiment, the step of initializing the higher-bit register and the lower-bit register initializes the higher-bit register in response to the first higher read-control signal and initializes the lower-bit register in response to the second lower read-control signal.

In this embodiment, the second verifying voltage is higher than the first verifying voltage that is higher than the read voltage.

In this embodiment, a program voltage raised by a stepping voltage is supplied to the selected wordline at every execution of the second outputting step in programming cycles carried out after the second verifying step and the second outputting step.

In this embodiment, a program voltage raised by a stepping voltage is supplied to the selected wordline at every execution of the third outputting step in programming cycles carried out after the third verifying step and the third outputting step.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, an exemplary embodiment of the present invention in conjunction with the accompanying drawings will be described.

Figure 1:
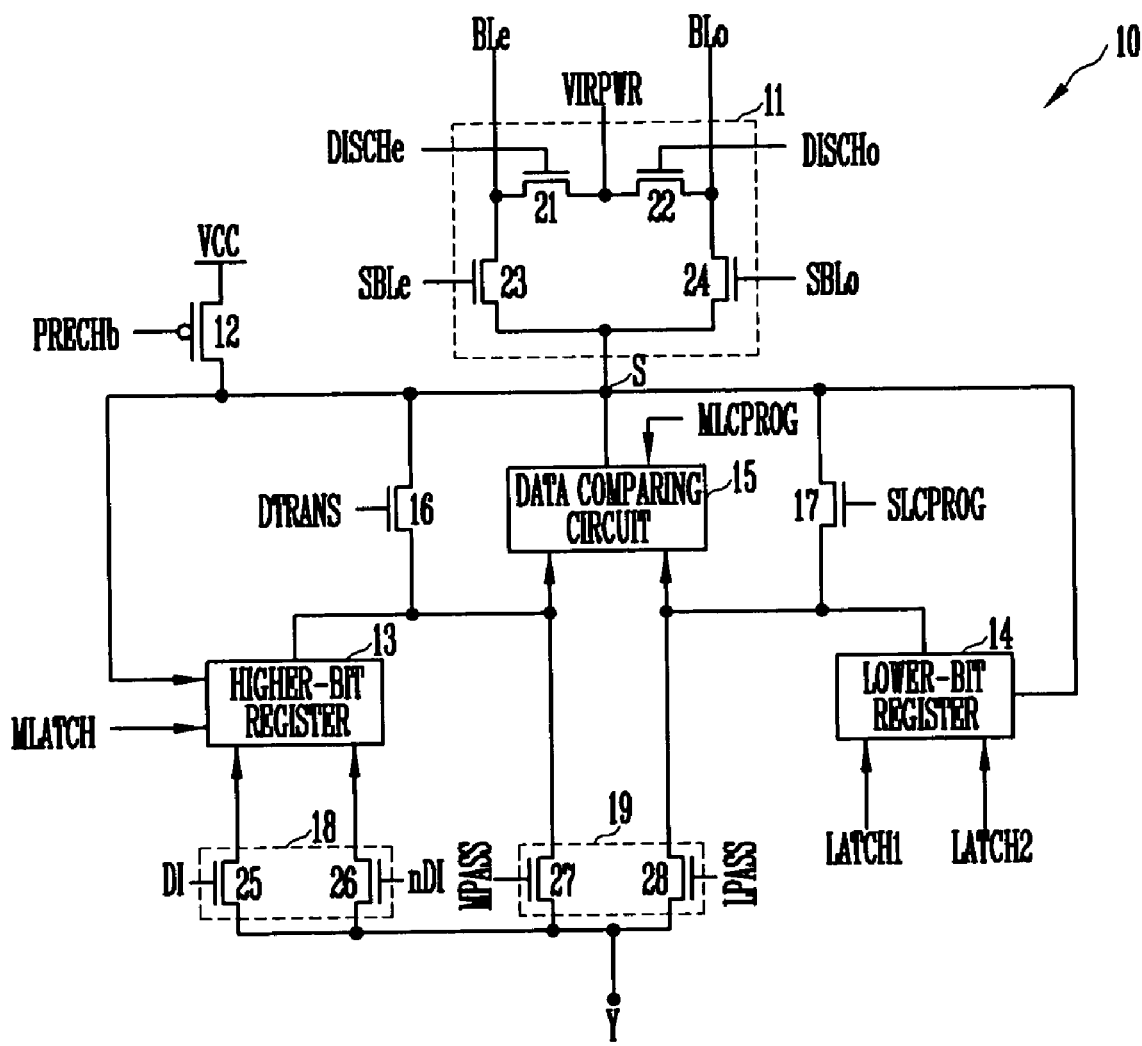
FIG. 1 is a schematic diagram showing a page buffer circuit of a conventional flash memory device.
Figure 2:
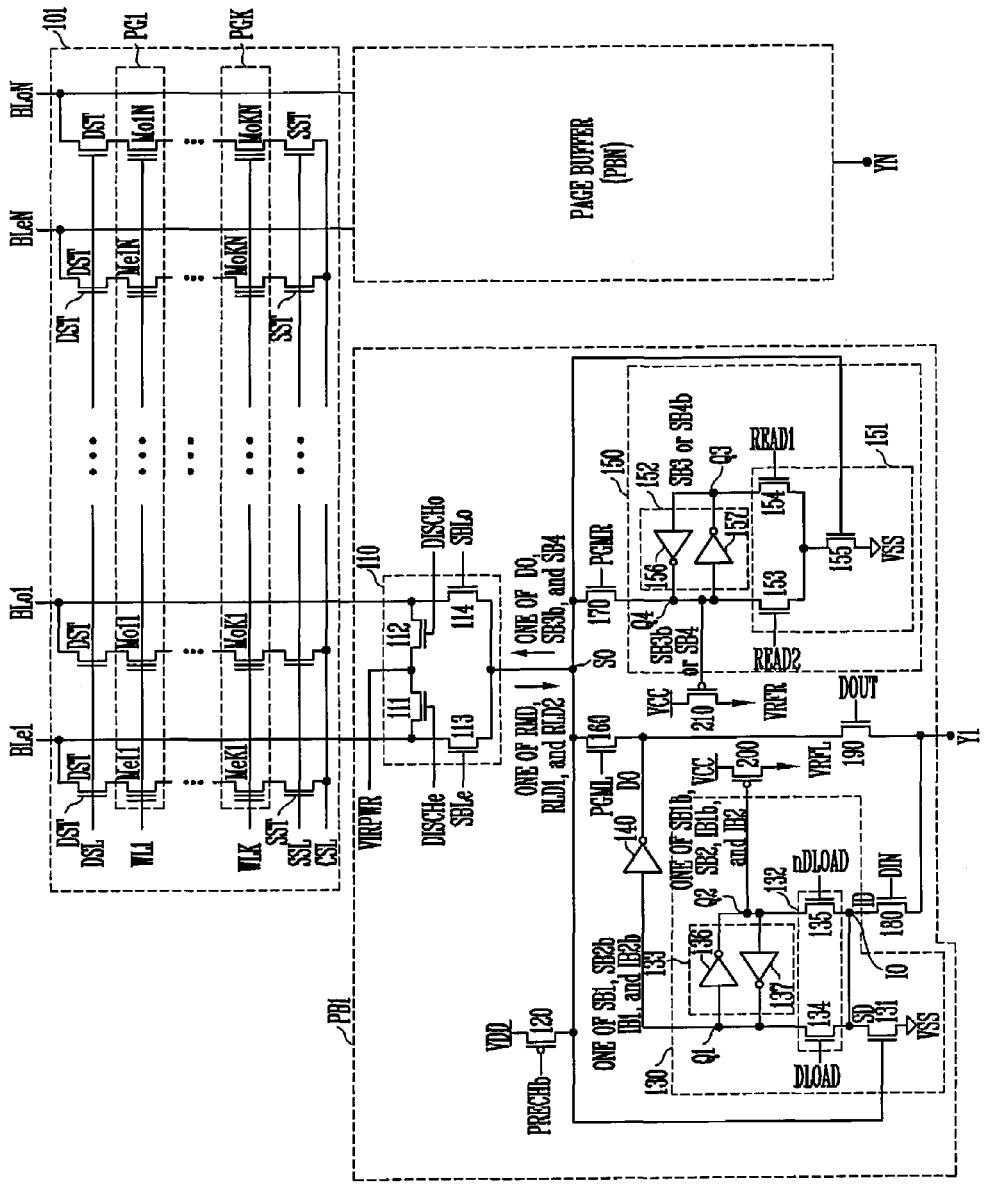
FIG. 2 is a diagram illustrating page buffer circuits and memory cell blocks in accordance with an embodiment of the present invention.

FIG. 2 is a diagram illustrating page buffer circuits and memory cell blocks in accordance with an embodiment of the present invention. Referring to FIG. 2, the memory cell block 101 is comprised of multi-level cells Me11~MeKN and Mo11~MoKM (K and N are integers) sharing bitlines BLe1~BLeN and BLo1~BLoN (N is an integer) and wordlines WL1~WLK (K is an integer). The memory cell block 101 is also comprised of drain selection transistors DST connected to a drain selection line DSL and source selection transistors SST connected to a source selection line SSL. In the memory cell block 101, the multi-level cells Me11~MeKN and Mo11~MoKN are coupled to a single one of the wordlines, e.g., WL1, constitutes one page (e.g., PG1).

Pluralities of page buffers PB1~PBN (N is an integer) are connected to the bitlines BLe1~BLeN and BLo1~BLeK, respectively. For example, the page buffer PB1 is connected to the bitlines BLe1 and BLo1. The structures and operations of the page buffers PB1~PBN are substantially the same altogether, so hereinafter they will be described with the page buffer PB1 as a representative sample. The page buffer PB1 is comprised of a bitline selection circuit 110, a precharge circuit 120, a higher-bit register 130, an output drive circuit 140, a lower-bit register 150, transmission circuits 160 and 170, a data input circuit 180, a data output circuit 190, and verifying circuits 200 and 210. The bitline selection circuit 110 selects one of the bitlines BLe1 and BLo1 in response to bitline selection signals SBLe and SBLo and discharge signals DISCHe and DISCHo and connects the selected bitline BLe or BLo to a sensing node SO. The bitline selection circuit 110 is comprised of NMOS transistors 111~114. Detailed operations of the NMOS transistors 111~114 may be easily understood by those skilled in this art, so they will not be described here. The precharge circuit 120 preliminarily charges the sensing node SO up to an internal voltage Vcc in response to a precharge control signal PRECHb. Preferably, when the precharge control signal PRECHb is being disabled, the precharge circuit 120 sets the sensing node SO to the internal voltage Vcc.

The higher-bit register 130 is comprised of a sensing circuit 131, an input circuit 132, and a latch circuit 133. The sensing circuit 131 may be implemented with an NMOS transistor. The sensing circuit 131 detects a voltage at the sensing node SO, generating a sensing data bit SD to an input/output node IO in accordance with the result of the detection. In more detail, when the sensing node SO is staying on a logically high level in voltage, the sensing circuit 131 discharges the input/output node IO to a ground voltage VSS. The input circuit 132 outputs a higher sensing data bit SB1 or an internal data bit IB1 to a node Q1 in response to a first higher read-control signal DLOAD and the sensing data bit SD or an input data bit ID received through the input/output node IO. Further, The input circuit 132 outputs a higher sensing data bit SB2 or an internal data bit IB2 to a node Q2 in response to a second higher read-control signal nDLOAD and the sensing data bit SD or an input data bit ID received through the input/output node IO. In more detail, the input circuit 132 includes switching circuits 134 and 135. Each of the switching circuits 134 and 135 may be implemented with an NMOS transistor. The switching circuit 134 is connected between the node IO and the input/output node IO, which is turned on or off in response to the first higher read-control signal DLOAD. Preferably, when the first higher read-control signal DLOAD is being enabled, the switching circuit 134 is turned on to connect the input/output node IO with the sensing node SO. As a result, the higher sensing data bit SB1 appears at the node Q1 in correspondence with the sensing data bit SD generated by the sensing circuit 131, or the internal data bit appears at the node Q1 in correspondence with the input data bit ID. The switching circuit 135 is connected between the node Q2 and the input/output node IO, which is turned on or off in response to the second higher read-control signal nDLOAD. Preferably, when the second higher read-control signal nDLOAD is being enabled, the switching circuit 135 is turned on to connect the input/output node IO with the sensing node SO. As a result, the higher sensing data bit SB2 appears at the node Q2 in correspondence with the sensing data bit SD generated by the sensing circuit 131, or the internal data bit appears at the node Q2 in correspondence with the input data bit ID.

The latch circuit 133 includes inverters 136 and 137. An input terminal of the inverter 136 and an output terminal of the inverter 137 are connected to the node Q1 while an output terminal of the inverter 136 and an input terminal of the inverter 137 are connected to the node Q2. The latch circuit 133 holds the higher sensing data bit SB1 or the internal data bit IB1 received by way of the node Q1, and outputs an inversed higher sensing data bit SB1b or an inversed internal data bit IB1b to the node Q2. The latch circuit 133 holds the higher sensing data bit SB2 or the internal data bit IB2 received by way of the node Q2, and outputs an inversed higher sensing data bit SB2b or an inversed internal data bit IB2b to the node Q1.

The output drive circuit 136 generates an output data bit DO in response to one of the sensing data bits SB1 and SB2b which are received from the node Q1. In more detail, the output drive circuit 140 may be implemented with an inverter. In this case, the current drivability of the inverter acting as the output drive circuit 140 is preferably higher than those of the inverters 136 and 137 because it needs to drive output circuits (i.e., external loading circuits). The output drive circuit 140 inverses one of the internal data bits IB1 and IB2b or one of the higher sensing data bits SB1 and SB2b, and generates the inverse data bit as the output data bit DO.

The lower-bit register 150 is comprised of a sensing circuit 151 and a latch circuit 152. The sensing circuit 151 includes 153~155. The sensing circuit 151 detects a voltage at the sensing node SO in response to a first or second lower read-control signal, READ1 or READ2, and generates a lower sensing data bit SB3 or SB4 to a node Q3 and Q4.

Each of the transmission circuits 160 and 170 may be implemented with an NMOS transistor. The transmission circuit 160 transfers the output data bit DO to the sensing node SO in response to a program control signal PGML. In more detail, the transmission circuit 160 is connected between an output terminal of the output drive circuit 140 and the sensing node SO, connecting or disconnecting the output terminal of the output drive circuit 140 with the sensing node SO in response to the program control signal PGML. Preferably, when the program control signal PGML is being enabled, the transmission circuit 160 connects the output drive circuit 140 with the sensing node SO. The transmission circuit 170 transfers the lower sensing data bit SB3b or SB4 to the sensing node SO in response to a program control signal PGMR. In more detail, the transmission circuit 170 is connected between the node Q4 and the sensing node SO, connecting or disconnecting the node Q4 with the sensing node SO in response to a program control signal PGMR. Preferably, when the program control signal PGMR is being enabled, the transmission circuit 170 connects the node Q4 with the sensing node SO.

The data input circuit 180 outputs the input data bit ID to the input/output node IO in response to an input control signal DIN. In more detail, the data input circuit 180 is connected between a data input/output node Y1 and the input/output node IO, which may be implemented with a switching circuit such as an NMOS transistor being turned on or off in response to the input control signal DIN. Preferably, when the input control signal DIN is being enabled, the data input circuit 180 connects the data input/output node Y1 to the input/output node IO. As the data input/output node Y1 is provided with the ground voltage VSS while loading a data of the higher-bit register 130, the data input circuit 180 outputs the input data bit ID of logical low level, which is received from the data input/output node Y1, to the input/output node IO.

The data output circuit 190 generates the output data bit DO to the data input/output node Y1 in response to an output control signal DOUT. In more detail, the data output circuit 190 is connected between an output terminal of the output drive circuit 140 and the data input/output node Y1, which may be implemented by a switching circuit such as an NMOS transistor being turned on or off in response to the output control signal DOUT. Preferably, when the output control signal DOUT is being enabled, the data output circuit 190 connects the output terminal of the output drive circuit 140 to the data input/output node Y1.

Each of the verifying circuits 200 and 210 may be implemented with a PMOS transistor. The verifying circuit 200 generates a higher verifying data bit VRFL in response to one of the higher sensing data bits SB1b and SB2, or one of the internal data bits IB1b and IB2. Preferably, when one of the higher sensing data bits SB1b and SB2 or one of the internal data bits IB1b and IB2 is on a logical low level, the verifying circuit 200 outputs the higher verifying data bit VRFL of a logical high level (i.e., the level of the internal voltage VCC). The verifying circuit 210 generates a lower verifying data bit VRFR in response to receiving one of the higher sensing data bits SB3b and SB4. Preferably, when one of the higher sensing data bits SB3b and SB3 is on a logical low level, the verifying circuit 210 outputs the higher verifying data bit VRFL of a logical high level (i.e., the level of the internal voltage VCC). internal voltage Now, a procedure of reading a data bit by the page buffer circuit in accordance with an embodiment of the present invention will be described in detail with reference to FIGS. 3 through 8. For the convenience of explanation, in this embodiment, it is assumed that a data bit is read out from the multi-level cells Me11~Me1N of the page PG1. The data bit will also be described with an operation of the page buffer circuit PB1 as an example.

Figure 4:
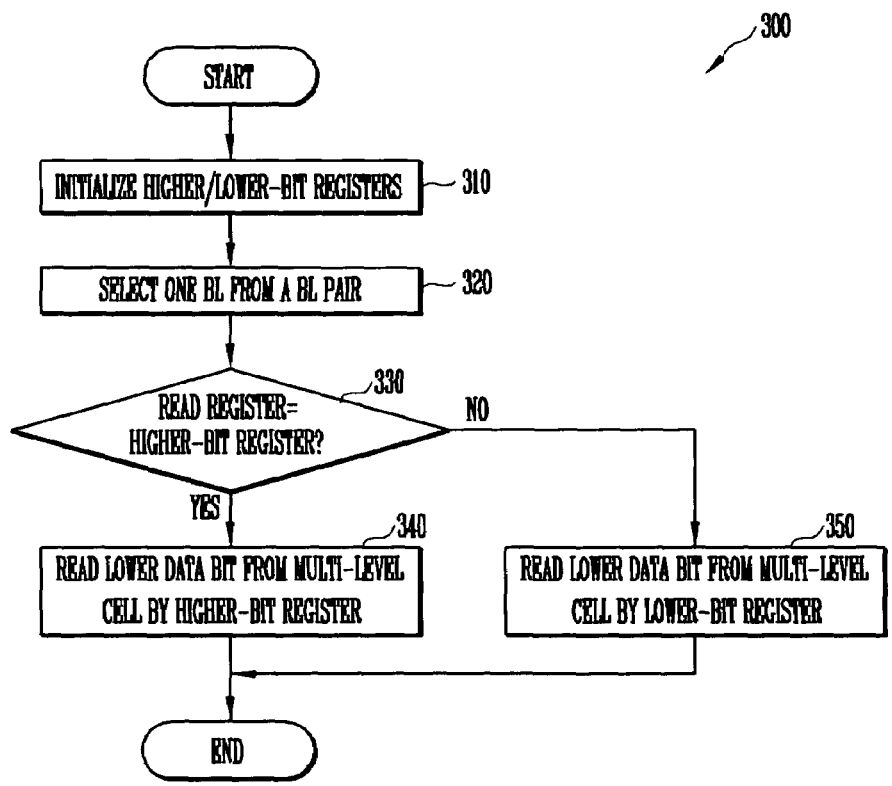
FIG. 4 is a flow chart showing the procedure of a reading operation by the page buffer circuit according to an embodiment of the present invention.

FIG. 4 is a flow chart showing the procedure of a reading operation by the page buffer circuit according to the embodiment of the present invention, which illustrates processing steps by the page buffer circuit PB1 for reading a lower data bit from a selected multi-level cell. Referring to FIG. 4, first, the higher-bit register 130 and the lower-bit register 150 are initialized (step 310). The initializing procedure in further detail for the higher-bit register 130 is as follows in conjunction with FIG. 7. In an initializing period T1, when the precharge control signal PRECHb is being disabled, the precharging circuit 120 charges the sensing node SO up to the level of the internal voltage VCC in response to the precharge control signal PRECHb. As a result, the sensing circuit 131 discharges the input/output node IO to the ground voltage VSS in response to a voltage of the sensing node SO, generating the sensing data bit SD to the input/output node IO. Thereafter, when the second higher read-control signal nDLOAD is being enabled, the input circuit 132 connects the input/output node IO with the node Q2 in response to the second higher read-control signal nDLOAD. As a result, the sensing data bit SD with logical '0' is output to the node Q2 as the higher sensing data bit SB2. And, the latch circuit 133 stores the higher sensing data bit SB2 of logical '0', thereby completing the initialization for the higher-bit register 130. The initializing procedure in further detail is as follows for the lower-bit register 150 in conjunction with FIG. 8. In an initializing period T2, when the precharge control signal PRECHb is being disabled, the precharging circuit 120 charges the sensing node SO up to the level of the internal voltage VCC in response to the precharge control signal PRECHb. Thereafter, the sensing circuit 151 discharges the node Q4 to the level of the ground voltage VSS in response to a voltage of the sensing node SO and the second lower read-control signal READ2 when the second lower read-control signal READ2 is being enabled, generating the lower sensing data bit SB4 to the node Q4. As a result, the latch circuit 133 stores the lower sensing data bit SB4 of logical '0', thereby completing the initialization for the lower-bit register 150.

Referring to FIG. 4 again, the bitline selection circuit 110 designates one of the bitlines BLe1 and BLo1, e.g., BLe1, in step 320. As a result, the multi-level cell Me11 is selected as an example. As the operation of the page buffer circuit PB1 by step 320 may be easily understood by those skilled in this art, it will not be described in detail hereinafter. After that, it determines whether the read register is the lower-bit register 130 (step 330). In step 330, the determination for the type of the read register may be carried out in accordance with the condition of whether one of the first and second lower read-control signals (READ1 and READ2) is being enabled or whether one of the first and second higher read-control signals (DLOAD and nDLOAD) is being enabled. In other words, when one of the first and second higher read-control signals (DLOAD and nDLOAD) is being enabled, the higher-bit register 130 functions as the read register. Otherwise, when one of the first and second lower read-control signals (READ1 and READ2) is being enabled, the lower-bit register 150 functions as the read register. If the higher-bit register 130 is assigned to the read register, a lower data bit is read out from the selected multi-level cell Me11 by the higher-bit register 130 (step 340). Otherwise, if the higher-bit register 130 is not assigned to the read register, (i.e., if the lower-bit register 150 is assigned to the read register) a lower data bit is read out from the selected multi-level cell Me11 by the higher-bit register 130 (step 350).

Figure 5:
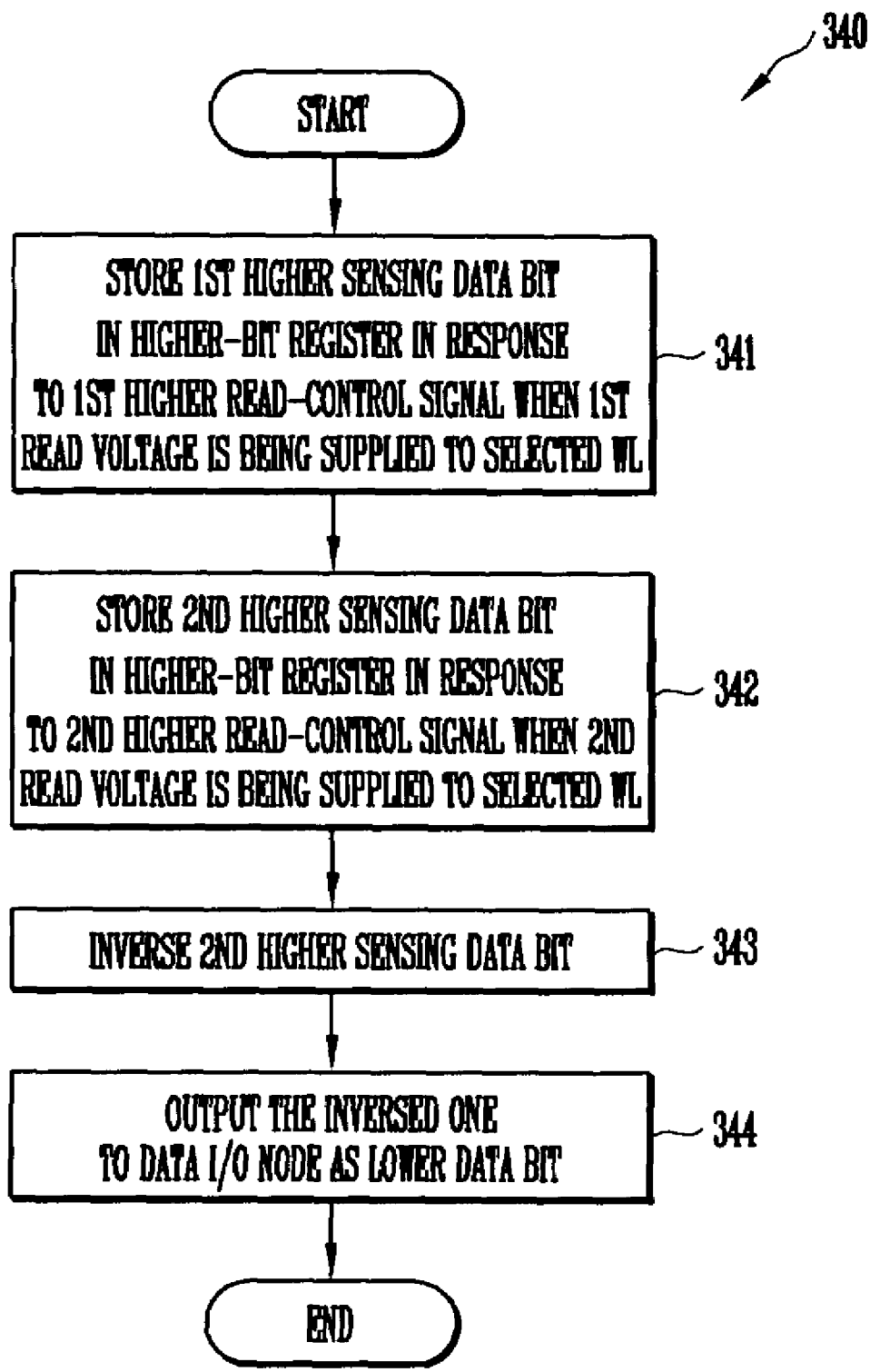
FIG. 5 is a detailed flow chart of the step 340 shown in FIG. 4.
Figure 7:
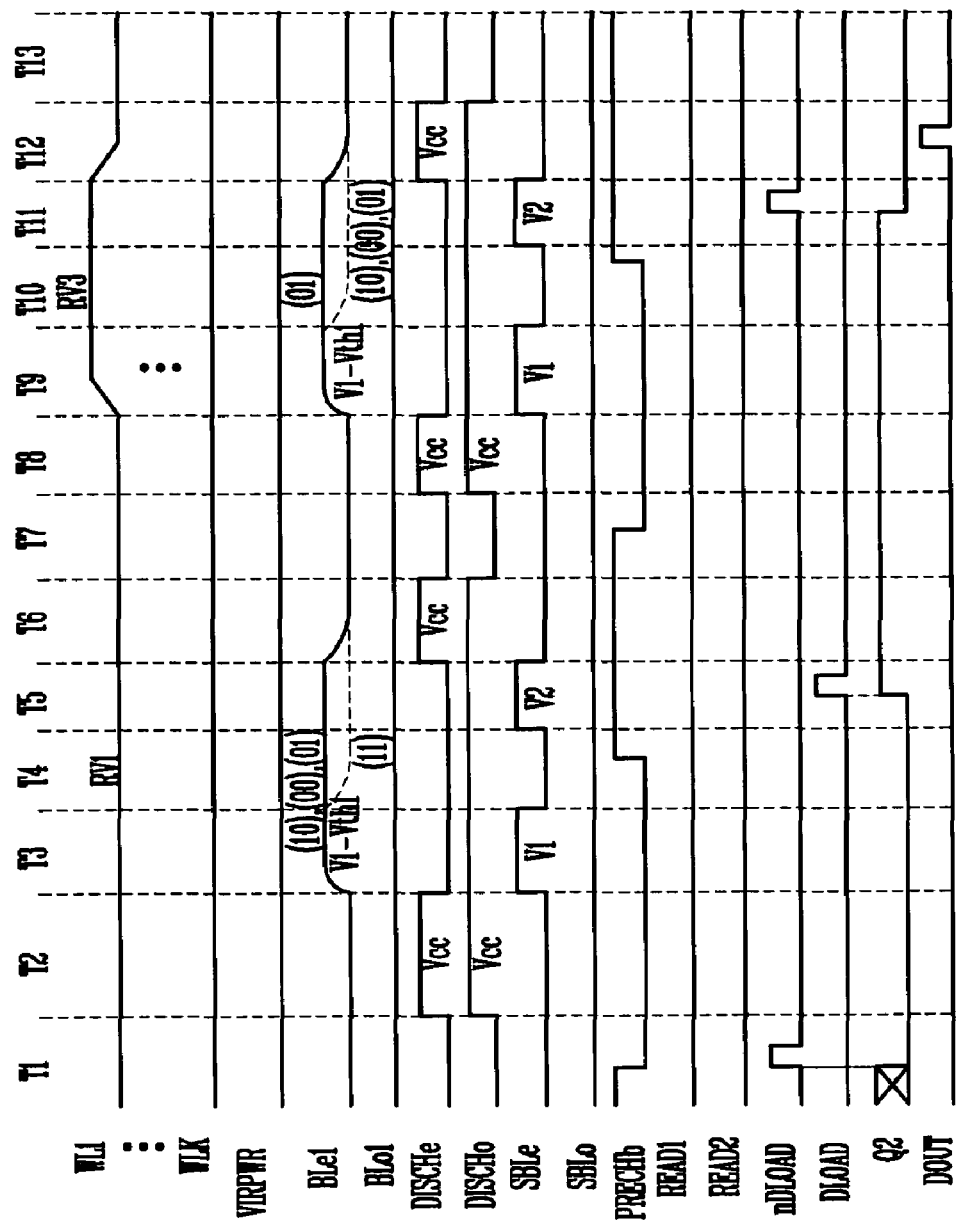
FIGS. 7 and 8 are timing diagrams of signals associated with the reading operation by the page buffer circuit in accordance with an embodiment of the present invention.

With reference to FIGS. 5 and 7, step 340 will be described in further detail. First, when a read voltage RV1 is being supplied to the selected one of the wordlines, e.g., WL1, the higher-bit register 130 stores the first higher sensing data bit SB1 therein, in response to the first higher read-control signal DLOAD (step 341). In more detail, as the read voltage RV1 is being supplied to the selected wordline WL1 during periods T1~T8, a read data bit RLD1 is output from the selected multi-level cell Me11. Here, the reading voltage RV1 is positioned between a threshold voltage of an erased multi-level cell (i.e., a multi-level cell storing the data stat of '11') and a threshold voltage of a multi-level cell storing the data stat of '10'.

During the period T2, the discharge signals DISCHe and DISCHo are being enabled while the precharge signal PRECHb is being disabled. As a result, the precharging circuit 120 preliminarily charges the sensing node SO up to the level of the internal voltage VCC in response to the precharge control signal PRECHb, and the bitline selection circuit 110 discharges the bitlines BLe1 and BLo1 to a voltage level of the bitline control signal VIRPWR (i.e., the level of the ground voltage VSS).

Thereafter, during the period T3, the bitline selection signal SBLe is being enabled while the bitline selection signal SBLo is being disabled and the discharge signal DISCHe is being disabled while the discharge signal DISCHo maintains an active condition. The bitline selection circuit 110 connects the bitline BLe1 to the sensing node SO and disconnects the bitline BLo1 with the sensing node SO, in response to the bitline selection signals SBLe and SBLo and the discharge signals DISCHe and DISCHo. As a result, the bitline BLe1 is precharged to a voltage of V1-Vth1 (Vth1 is a threshold voltage of an NMOS transistor 113) by the precharged voltage (i.e., the internal voltage VCC) of the sensing node SO. Meanwhile, the bitline BLo1 maintains the discharged state (i.e., the level of the ground voltage VSS).

During the period T4, the bitline selection signal SBLe is being disabled while the precharge control signal PRECHb is being enabled. The bitline selection circuit 110 disconnects the bitline BLe1 from the sensing node SO and the precharging circuit 120 stops precharging the sensing node SO. When one of the data states '10', '00', and '01' is set in the selected multi-level cell, the bitline BLe1 is maintained on the voltage level V1-Vth1. Thus, the read data bit RLD1 is generated with a logical '1'. Otherwise, if the data state '11' is stored in the selected multi-level cell Me11, a voltage level of the bitline BLe1 becomes lower, down into the level of the ground voltage VSS. As a result, the read data bit RLD1 is generated with a logical '0'.

During the period T5, the bitline selection signal SBLe is being enabled while the first higher read-control signal DLOAD is being enabled for an established time. As a result, the bitline BLe1 is connected to the sensing node SO, and a voltage at the sensing node SO changes to the level of the ground voltage VSS or maintains the voltage level V1-Vth1 in accordance with a voltage level (i.e., the logic value of the read data bit RLD1) of the bitline BLe1. The sensing circuit 131 discharges the input/output node 10 into the ground voltage VSS or stops the discharging operation in accordance with a voltage level of the sensing node SO. For instance, when the read data bit RLD1 is a logical '1', the sensing circuit 131 discharges the input/output node IO into the level of the ground voltage VSS. When the first higher read-control signal DLOAD is being enabled, the switching circuit 134 of the higher-bit register 130 connects the input/output node IO to the node Q1. Thus, the first higher sensing data bit SB1 is generated with a logical '0' at the node Q1 and the latch circuit 133 holds the first higher sensing data bit SB1. When the read data bit RLD1 is a logical '0', the sensing circuit 131 does not operate and the latch circuit 133 stays at initialization, i.e., the latch circuit 133 is latching the higher sensing data bit SB2 with a logical '0'.

Figure 3:
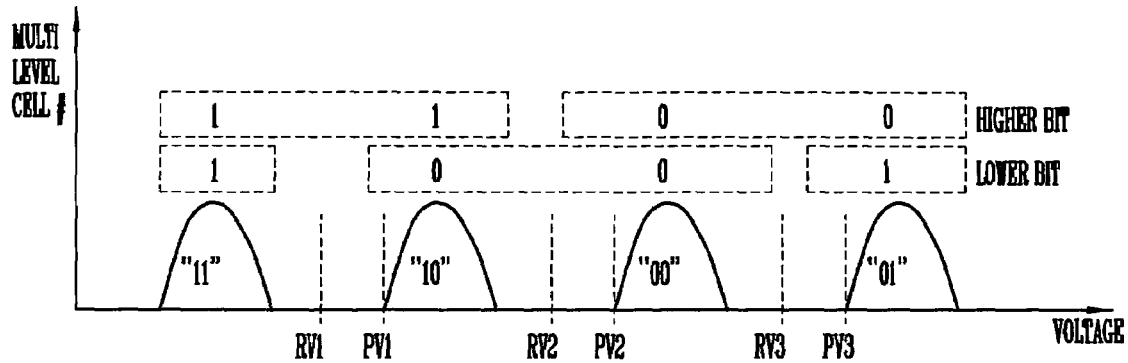
FIG. 3 is a diagram illustrating distribution profiles for threshold voltages of multi-level cells, which vary during a programming operation by the page buffer circuit in accordance with the present invention.

Thereafter, when a read voltage RV3 is supplied to the selected bitline WL1, the higher-bit register 130 stores the higher sensing data bit SB2 in response to the second higher read-control signal nDLOAD (step 342). In further detail, during periods T9~T11, the read data bit RLD2 is output from the selected multi-level cell Me11 while the read voltage RV3 is being supplied to the selected wordline WL1. Here, the read voltage RV3, as referred by FIG. 3, is positioned between a threshold voltage of a multi-level cell storing the data state '00' and a threshold voltage of a multi-level cell storing the data state '01'. Therefore, the read voltage RV3 is higher than the read voltage RV1. The step 342 is similar to the step 341, except a read voltage applied to the wordline WL1 and a read data bit therefrom, so it will not be described in more detail. As an example, if the selected multi-level cell Me11 stores the data state '01', the bitline BLe1 maintains the voltage level V1-Vth1 for the period T10. In other words, the read data bit RLD2 is output with a logical '1' from the selected multi-level cell Me11. If the selected multi-level cell Me11 stores one of the data states '11', '10', and '00', the voltage level of the bitline BLe1 gradually degrades to the level of the ground voltage VSS. Namely, the read data bit RLD2 of logical '0' is output from the selected multi-level cell Me11.

As a result, the higher-bit register 130 stores the second higher sensing data bit SB2 of logical '0' or maintains the first higher sensing data bits SB1 that has been already stored therein in the period T5, in accordance with a voltage level of the sensing node SO. Thus, the node Q2 is set to a logical '1' or '0'. The output drive circuit 140 inverses one of the higher sensing data bits SB1 and SB2b received from the node Q1 (step 343). Thereafter, when the output control signal DOUT is being enabled in period T12, the data output circuit 190 generates an inverse of the higher sensing data bit SB1b or SB2 (i.e., the output data bit DO) to the data input/output node Y1 as a lower data bit. As such, reading the lower data bit from the multi-level cell twice is to read the lower data bit correctly from the multi-level cell Me11. By such a way a two-time read operation confirms whether a data bit stored in the multi-level cell Me11 is one of the data states '10' and '00', or one of the states '11' and '01'. For instance, if the multi-level cell Me11 stores one of the data states '11' and '01', the data output circuit 190 generates a lower data bit of logical '0'. If the multi-level cell Me11 stores one of the data states '10' and '11', the data output circuit 190 generates a lower data bit of logical '1'.

Figure 6:
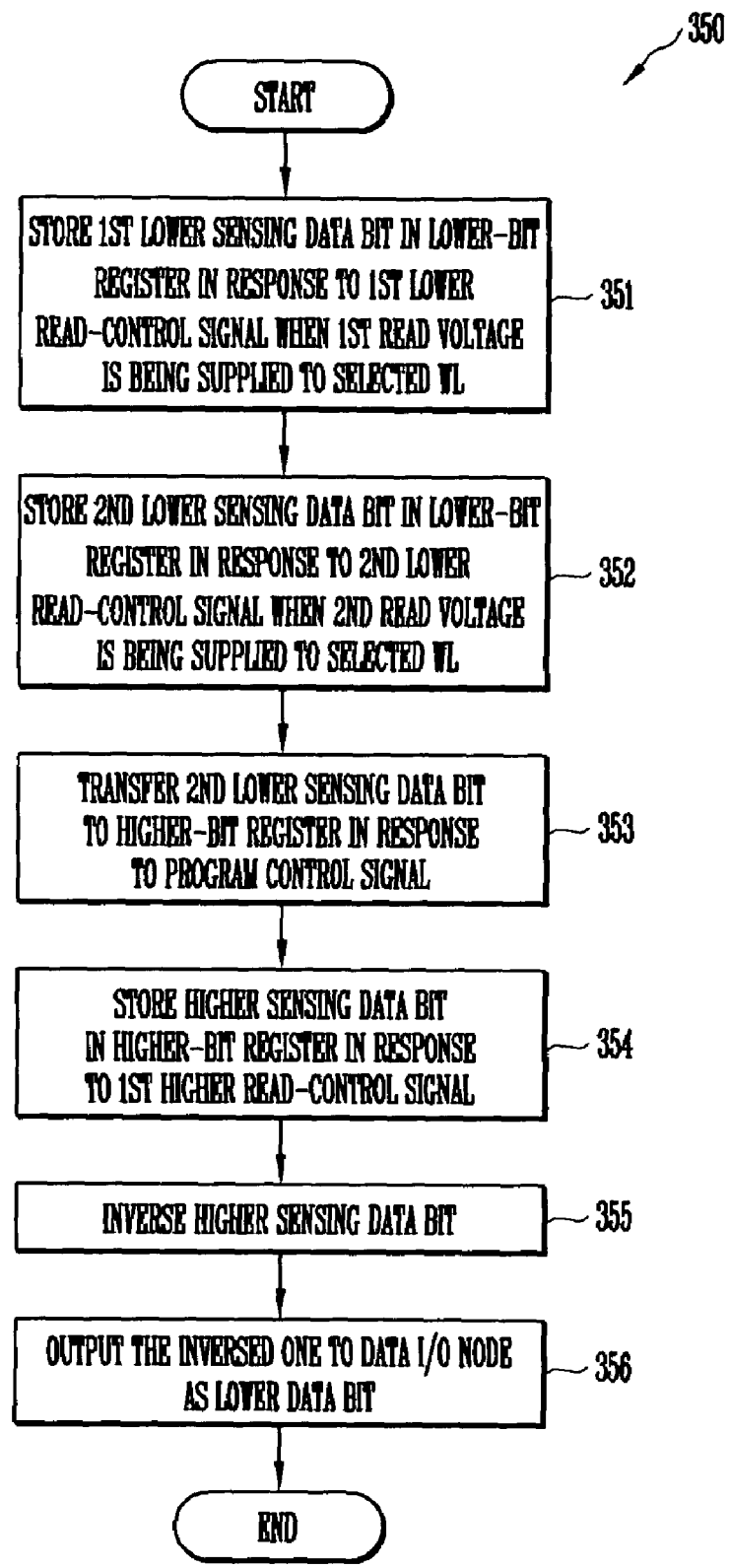
FIG. 6 is a detailed flow chart of the step 350 shown in FIG. 4.
Figure 8:
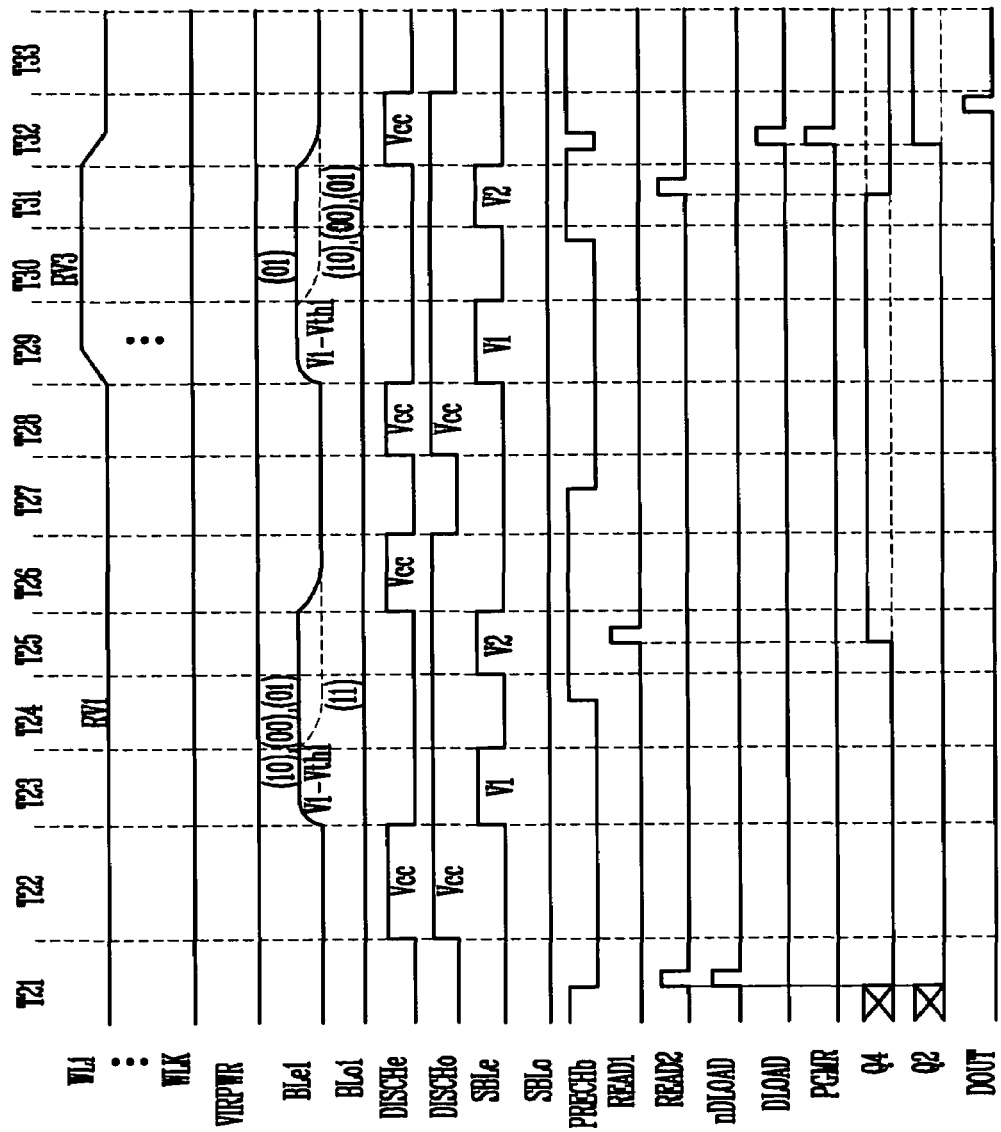

Next, step 350 will be described in further detail with reference to FIGS. 6 and 8. First, when a read voltage RV1 is being supplied to the selected wordline WL1, the lower-bit register 150 stores the first lower sensing data bit SB3 therein, in response to the first lower read-control signal READ1 (step 351). In more detail, as the read voltage RV1 is being supplied to the selected wordline WL1 during periods T21~T28, a read data bit RLD1 is output from the selected multi-level cell Me11. The operation of the page buffer circuit PB1 for the periods T21~T28 is substantially similar to the periods T1~T4, so it will not be described in detail.

During the period T25, the bitline selection signal SBLe is being enabled while the first lower read-control signal READ1 is being enabled for an established time. As a result, the bitline BLe1 is connected to the sensing node SO, and a voltage at the sensing node SO changes to the level of the ground voltage VSS or maintains the voltage level V1-Vth1 in accordance with a voltage level (i.e., the logic value of the read data bit RLD1) of the bitline BLe1. The sensing circuit 151 generates the first lower sensing data bit SB3 of logical '0' into the node Q3 or does not generate it in response to a voltage level of the sensing node SO determined by the read data bit RLD1 and the first lower read-control signal READ1. For instance, when the read data bit RLD1 is a logical '1', the sensing circuit 151 generates the first lower sensing data bit SB3 of logical '0' to the node Q3 and the latch circuit 152 stores the first lower sensing data bit SB3. When the read data bit RLD1 is a logical '1', the sensing circuit 151 does not operate and the latch circuit 152 stays at initialization, i.e., the latch circuit 152 is latching the lower sensing data bit SB4 with a logical '0'.

Thereafter, when the read voltage RV3 is supplied to the selected bitline WL1, the lower-bit register 150 stores the second lower sensing data bit SB4 in response to the second lower read-control signal READ2 (step 352). In further detail, during periods T29~T31, the read data bit RLD2 is output from the selected multi-level cell Me11 while the read voltage RV3 is being supplied to the selected wordline WL1. As an example, if the selected multi-level cell Me11 stores the data state '01', the bitline BLe1 maintains the voltage level V1-Vth1 for the period T30. In other words, the read data bit RLD2 is output with a logical '1' from the selected multi-level cell Me11. If the selected multi-level cell Me11 stores one of the data states '11', '10', and '00', the voltage level of the bitline BLe1 gradually degrades to be the level of the ground voltage VSS. Namely, the read data bit RLD2 of logical '0' is output from the selected multi-level cell Me11.

As a result, the lower-bit register 150 stores the second lower sensing data bit SB2 of logical '0' or maintains the first lower sensing data bits SB3 that has been already stored therein, in the period T25, in accordance with a voltage level of the sensing node SO. Thus, the node Q4 is set on a logical '1' or '0'.

Thereafter, during a period T32, when the program control signal PGMR is being enabled for an established time, the transmission circuit 170 transfers the second lower sensing data bit SB4 (or the first lower sensing data bit SB3b), which is being stored in the lower-bit register 150, to the higher-bit register 130 through the sensing node SO in response to the program control signal PGMR (step 353). Further, while the program control signal PGMR is being enabled in the period T32, the first higher read-control signal DLOAD is activated. Responding to the first higher read-control control signal DLOAD, the higher-bit register 130 detects a voltage at the sensing node SO, which is determined by the first lower sensing data bit SB3b, and stores the higher sensing data bit SB1 according to the detected result (step 354). Meantime, when the second lower sensing data bit SB3 (or the first lower sensing data bit SB3b) is a logical '0', the higher-bit register 130 maintains its initialization state (i.e., a state of storing the higher sensing data bit SB2).

The output drive circuit 140 inverses the higher sensing data bit SB1 (or SB2) that is received from the node Q1 (step 355). Thereafter, in the period T32, when the output control signal DOUT is being enabled, the data output circuit 190 generates an inverse (SB1b or SB2) of the higher sensing data bit (i.e., the output data bit DO) to the data input/output node Y1 as a lower data bit (step 356).

Now, a procedure will be described in detail about reading a data bit by the page buffer circuit PB1 in accordance with another embodiment of the present invention with reference to FIGS. 9 through 13. For the convenience of explanation, in this embodiment, it is assumed that a data bit is read out from the multi-level cells Me11~Me1N of the page PG1. It will also be described with an operation of the page buffer circuit PB1 as an example.

Figure 9:
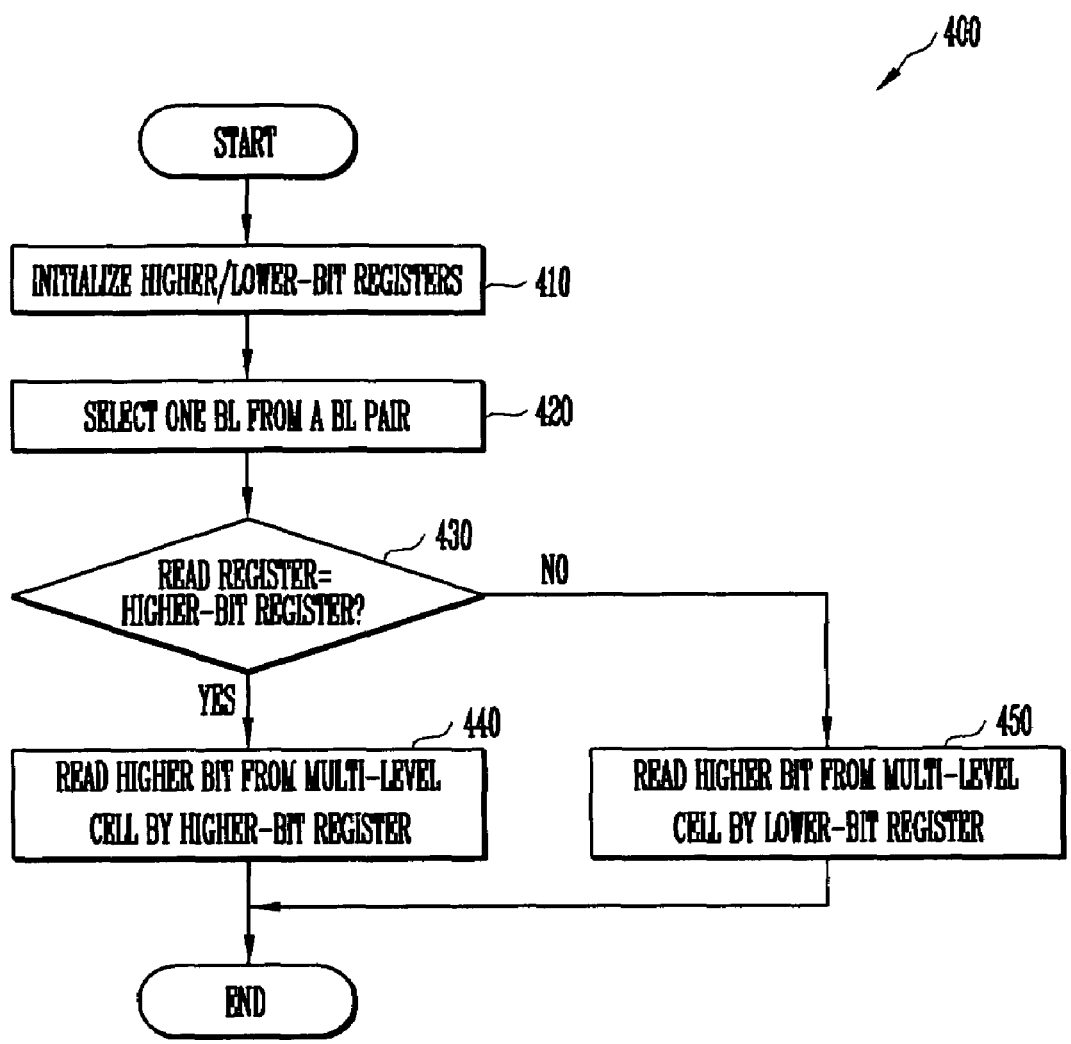
FIG. 9 is a flow chart showing the procedure of a reading operation by the page buffer circuit according to another embodiment of the present invention.

FIG. 9 is a flow chart showing the procedure of a reading operation by the page buffer circuit according to another embodiment of the present invention, which illustrates processing steps by the page buffer circuit PB1 for reading a higher data bit from a selected multi-level cell. Referring to FIG. 9, first, the higher-bit register 130 and the lower-bit register 150 are initialized (step 410). The step 410 is similar to the step 310 show in FIG. 4, so it will not be described in further detail.

The bitline selection circuit 110 designates one of the bitlines BLe1 and BLo1, e.g., BLe1, in step 420. As a result, the multi-level cell Me11 is selected as an example. After that, it determines whether a read register is the lower-bit register 130 (step 430). The step 430 for determining a type of the read register is carried out, which is similar to the step 430 aforementioned. If the higher-bit register 130 is assigned to the read register, a higher data bit is read out from the selected multi-level cell Me11 by the higher-bit register 130 (step 440). Otherwise, If the higher-bit register 130 is not assigned to the read register (i.e., if the lower-bit register 150 is assigned to the read register) a higher data bit is read out from the selected multi-level cell Me11 by the lower-bit register 150 (step 450).

Figure 10:
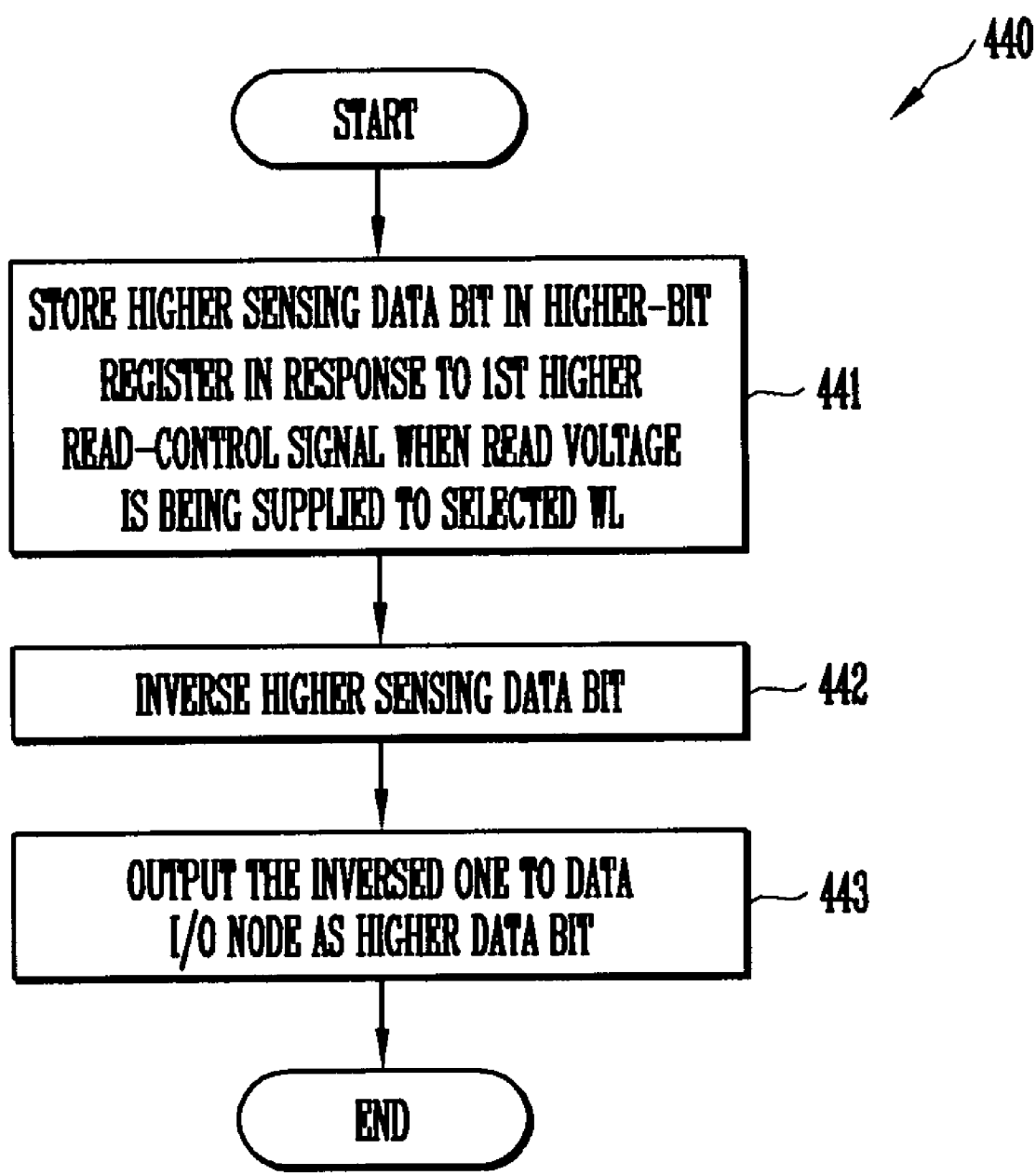
FIG. 10 is a detailed flow chart of the step 440 shown in FIG. 9.
Figure 12:
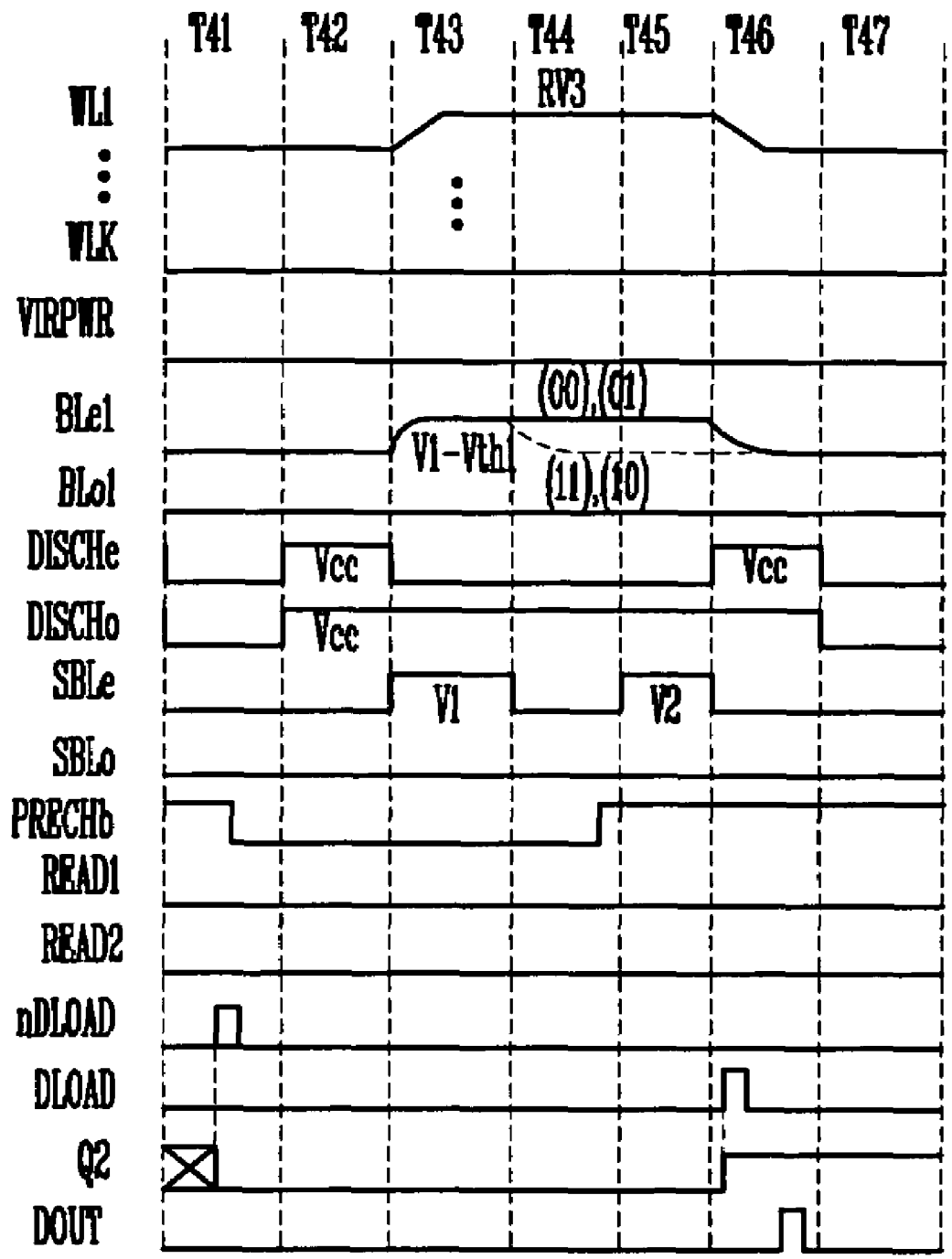
FIGS. 12 and 13 are timing diagrams of signals associated with the reading operation by the page buffer circuit in accordance with another embodiment of the present invention.

With reference to FIGS. 10 and 12, step 440 will be described in further detail. First, when a read voltage RV2 is being supplied to a selected wordline, e.g., WL1, the higher-bit register 130 stores the first higher sensing data bit SB1 therein in response to the first higher read-control signal DLOAD (step 441). In more detail, as the read voltage RV2 is being supplied to the selected wordline WL1 during periods T43~T48, a read data bit RMD is output from the selected multi-level cell Me11. Here, the reading voltage RV2 is positioned between a threshold voltage of a multi-level cell storing the data stat of '10' and a threshold voltage of a multi-level cell storing the data stat of '00'.

During the period T42, the discharge signals DISCHe and DISCHo are being enabled while the precharge signal PRE- CHb is being disabled. Preferably, the discharge signals DISCHe and DISCHo are designed to correspond to the internal voltage VCC. As a result, the precharging circuit 120 preliminarily charges the sensing node SO up to the level of the internal voltage VCC in response to the precharge control signal PRECHb, and the bitline selection circuit 110 discharges the bitlines BLe1 and BLo1 to a voltage level of the bitline control signal VIRPWR (i.e., the level of the ground voltage VSS).

Thereafter, during the period T43, the bitline selection signal SBLe is being enabled while the bitline selection signal SBLo is being disabled and the discharge signal DISCHe is being disabled while the discharge signal DISCHo maintains an active condition. The bitline selection circuit 110 connects the bitline BLe1 to the sensing node SO and disconnects the bitline BLo1 with the sensing node SO, in response to the bitline selection signals SBLe and SBLo and the discharge signals DISCHe and DISCHo. As a result, the bitline BLe1 is precharged to a voltage of V1-Vth1 (Vth1 is the threshold voltage of an NMOS transistor 113) by the precharged voltage (i.e., the internal voltage VCC) of the sensing node SO. Meanwhile, the bitline BLo1 maintains the discharged state (i.e., the level of the ground voltage VSS).

During the period T44, the bitline selection signal SBLe is being disabled while the precharge control signal PRECHb is being enabled. The bitline selection circuit 110 disconnects the bitline BLe1 from the sensing node SO and the precharging circuit 120 stops precharging the sensing node SO. When one of the data states '00' and '01' is set in the selected multi-level cell, the bitline BLe1 is maintained on the voltage level V1-Vth1 for the period T44. Thus, the read data bit RMD is generated with a logical '1'. Otherwise, if one of the data states '11' and '10' is stored in the selected multi-level cell Me11, the voltage level of the bitline BLe1 becomes lower, down into the level of the ground voltage VSS. As a result, the read data bit RMD is generated with a logical '0'.

During the period T45, as the bitline selection signal SBLe is being enabled, the bitline BLe1 is connected to the sensing node SO and the voltage at the sensing node SO changes to the level of the ground voltage VSS or maintains the voltage level V1-Vth1 in accordance with the voltage level (i.e., the logic value of the read data bit RLD1) of the bitline BLe1. The sensing circuit 131 discharges the input/output node IO into the ground voltage VSS or stops the discharging operation in accordance with a voltage level of the sensing node SO, which is determined by the read data bit RMD. For instance, when the read data bit RMD is a logical '1', the sensing circuit 131 discharges the input/output node IO into the level of the ground voltage VSS, generating the sensing data bit SD of logical '0' at the input/output node IO. When the first higher read-control signal DLOAD is being enabled, the switching circuit 134 of the higher-bit register 130 connects the input/output node IO to the node Q1. As a result, the sensing data bit SD of the input/output node IO is transferred to the node Q1 and the higher sensing data bit SB1 of logical '0' is generated at the node Q1. The latch circuit 133 holds the higher sensing data bit SB1. When the read data bit RMD is a logical '0', the sensing circuit 131 does not operate and the latch circuit 133 stays at its initialization state, i.e., the latch circuit 133 is latching the higher sensing data bit SB2 with a logical '0'.

The output drive circuit 140 inverses the sensing data bits SB1 received from the node Q1 (step 442). Thereafter, when the output control signal DOUT is being enabled in period T46, the data output circuit 190 generates an inverses of the higher sensing data bit, SB1b (i.e., the output data bit DO), to the data input/output node Y1 as a higher data bit (step 443).

Figure 11:
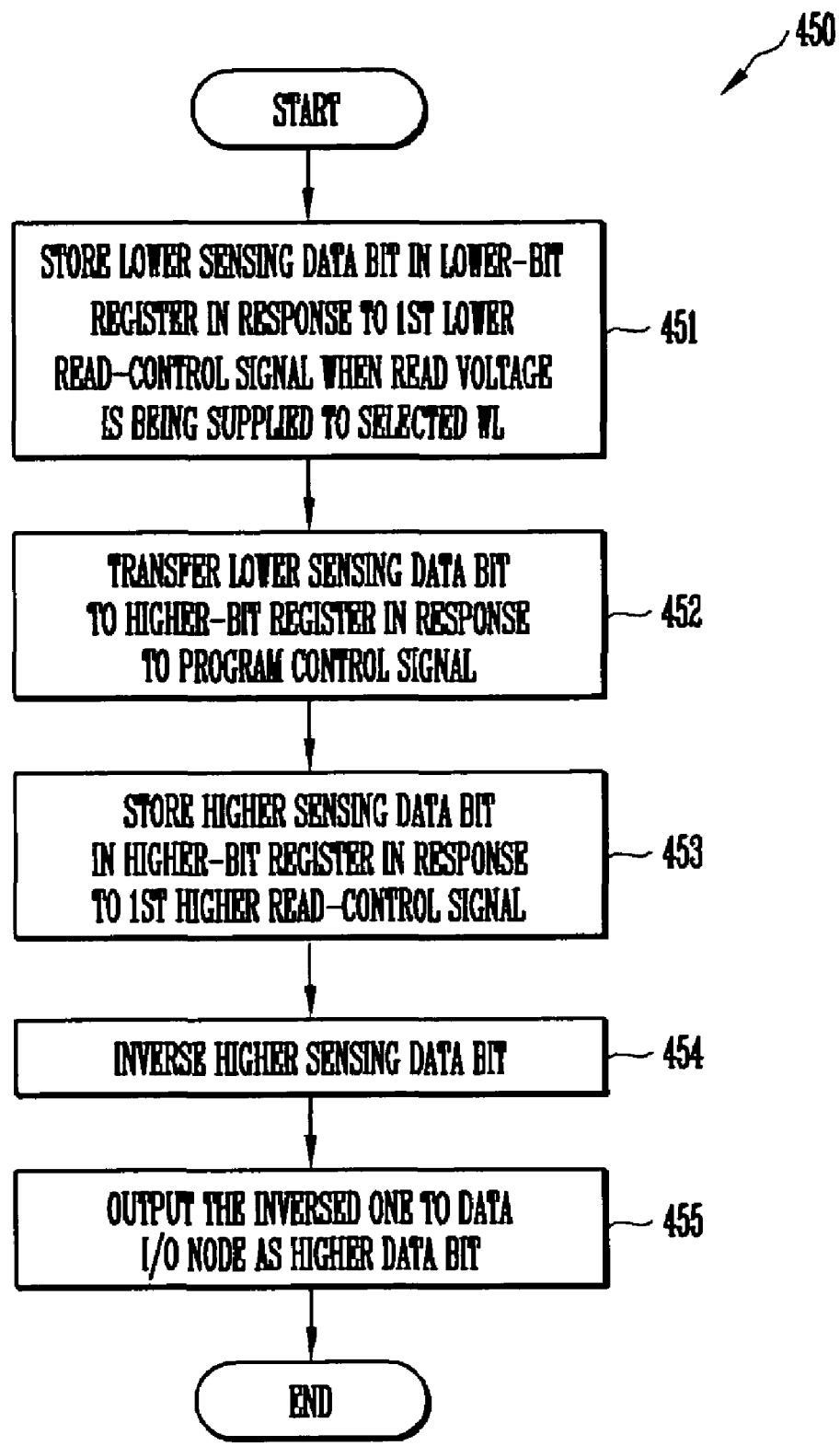
FIG. 11 is a detailed flow chart of the step 450 shown in FIG. 9.
Figure 13:
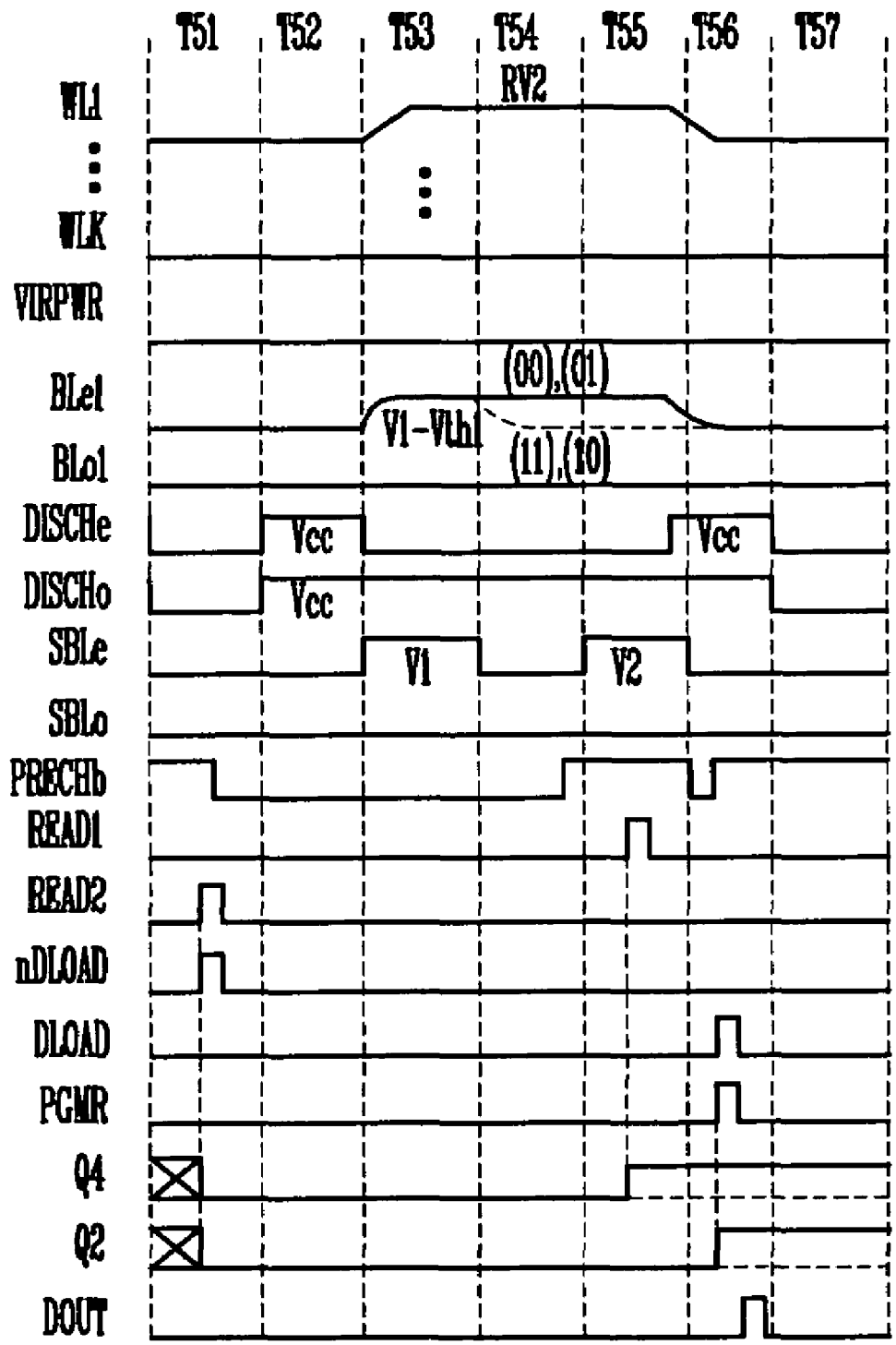

Next, with reference to FIGS. 11 and 13, step 450 will be described in further detail. First, when the read voltage RV2 is being supplied to the selected wordline WL1, the lower-bit register 150 stores the first lower sensing data bit SB3 therein in response to the first lower read-control signal READ1 (step 451). In more detail, as the read voltage RV2 is being supplied to the selected wordline WL1 during periods T53~T55, the read data bit RLD1 is output from the selected multi-level cell Me11. The operation of the page buffer circuit PB1 for the periods T52~T54 is substantially similar to the periods T1~T4, so it will not be described in detail.

Thereafter, during the period T55, the bitline selection signal SBLe is enabled. As a result, the bitline BLe1 is connected to the sensing node SO, and the voltage at the sensing node SO changes to the level of the ground voltage VSS or maintains the voltage level V1-Vth1 in accordance with the voltage level (i.e., the logic value of the read data bit RMD) of the bitline BLe1. The sensing circuit 151 generates the first lower sensing data bit SB3 of logical '0' into the node Q3 or does not generate it in response to a voltage level of the sensing node SO determined by the read data bit RMD while the first lower read-control signal READ1 is being enabled during the period T55. As a result, the lower-bit register 150 stores the lower sensing data bit SB3 of logical '0', or keeps the lower sensing data bit SB4 that has been already stored therein in the former period T51 (i.e., the initializing period). Thus, the node Q4 is set to a logical '1' or '0'.

Thereafter, during a period T56, when the program control signal PGMR is being enabled for an established time, the transmission circuit 170 transfers the first lower sensing data bit SB3b (or the second lower sensing data bit SB4), which is being stored in the lower-bit register 150, to the higher-bit register 130 through the sensing node SO in response to the program control signal PGMR (step 452). Further, while the program control signal PGMR is being enabled in the period T52, the first higher read-control signal DLOAD is activated. Responding to the first higher read-control control signal DLOAD, the higher-bit register 130 detects a voltage at the sensing node SO, which is determined by the first lower sensing data bit SB3b, and stores the higher sensing data bit SB1 according to the detected result (step 453). Meantime, when the lower sensing data bit SB3b (or the lower sensing data bit SB4) is a logical '0', the higher-bit register 130 maintains its initialization state (i.e., a state of storing the higher sensing data bit SB2). The output drive circuit 140 inverses the higher sensing data bit SB1 (or SB2b) that is received from the node Q1 (step 455). Thereafter, in the period T56, when the output control signal DOUT is being enabled, the data output circuit 190 generates an inverses of one (SB1b or SB2) of the higher sensing data bit (i.e., the output data bit DO) to the data input/output node Y1 as a higher data bit (step 455).

Now, a procedure of programming a data bit with the page buffer circuit in accordance with an embodiment of the present invention will be described in detail with reference to FIGS. 14 and 15. For the convenience of explanation, in this embodiment, the programming of the multi-level cells Me11~Me1N of the page PG1 will be used as an example. This embodiment will be exemplarily described with an operation of the page buffer circuit PB1.

Figure 14:
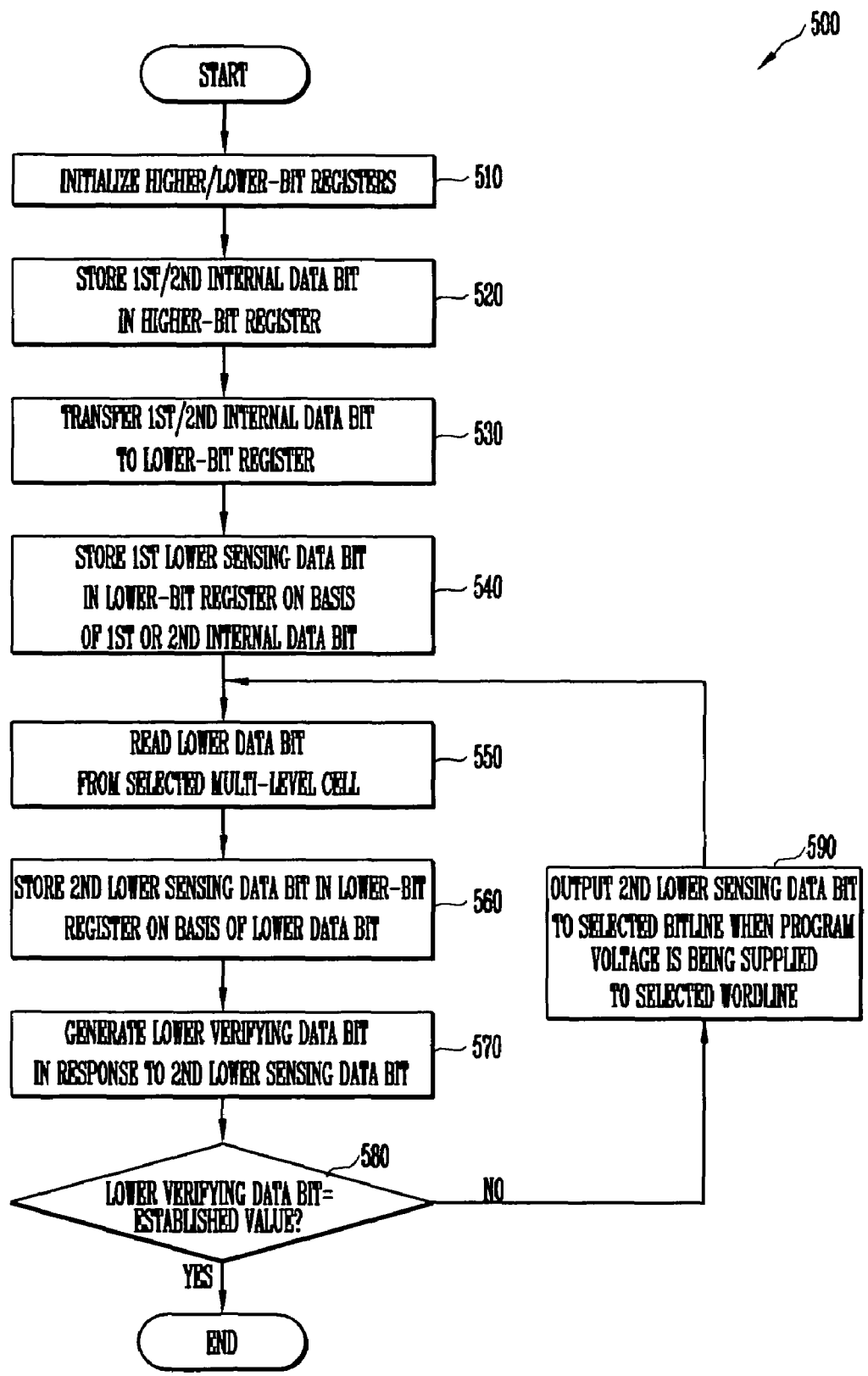
FIG. 14 is a flow chart showing the procedure of a programming operation by the page buffer circuit according to an embodiment of the present invention.
Figure 15:
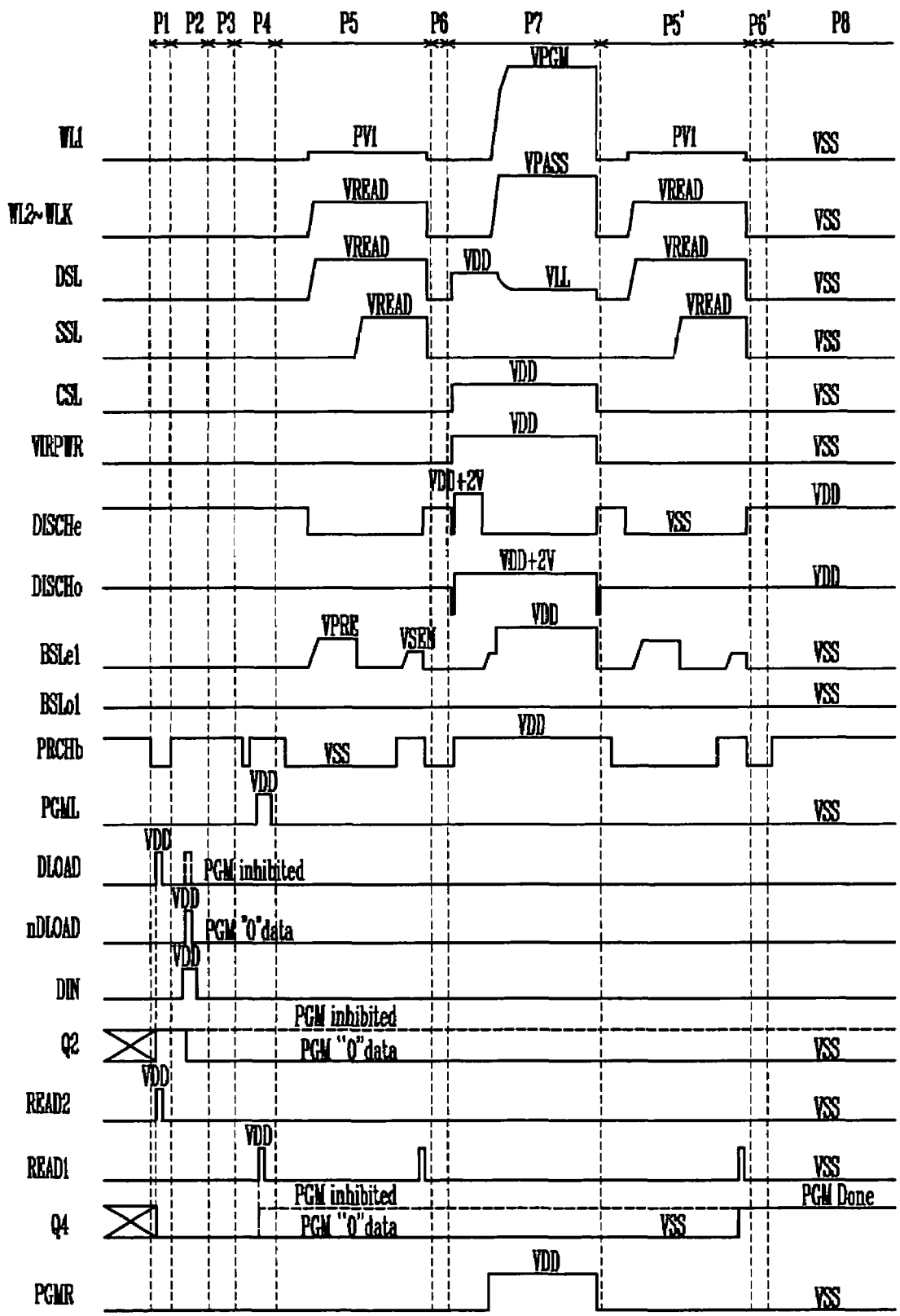
FIG. 15 is a timing diagram of signals associated with the programming operation by the page buffer circuit in accordance with an embodiment of the present invention.

FIG. 14 is a flow chart showing the procedure of a programming operation by the page buffer circuit according to an embodiment of the present invention, which illustrates processing steps by the page buffer circuit PB1 for programming a lower data bit into a selected multi-level cell. Referring to FIG. 14, first, the higher-bit register 130 and the lower-bit register 150 are initialized (step 510). In an initializing period P1, when the precharge control signal PRECHb is being disabled, the precharging circuit 120 charges the sensing node SO up to the level of the internal voltage VCC in response to the precharge control signal PRECHb. As a result, the sensing circuit 131 discharges the input/output node IO to the ground voltage VSS in response to a voltage of the sensing node SO, generating the sensing data bit SD of logically low level to the input/output node IO. Thereafter, when the first higher read-control signal DLOAD is being enabled, the switching circuit 134 of the input circuit 132 connects the input/output node IO with the node Q1 in response to the first higher read-control signal DLOAD. As a result, the sensing data bit SD with logical '0' is output to the node Q1 as the higher sensing data bit SB1. The latch circuit 133 stores the higher sensing data bit SB1 of logical '0', thereby completing the initialization for the higher-bit register 130. Further, in the period P1, when the second lower read-control signal READ2 is being enabled, the sensing circuit 151 of the lower-bit register 150 discharges the node Q4 into the level of the ground voltage VSS in response to a voltage of the sensing node SO and the second lower read-control signal READ2. As a result, the lower sensing data bit SB4 of logical '0' is generated at the node Q4 and the latch circuit 133 stores the lower sensing data bit SB4 of logical '0', thereby completing the initialization for the lower-bit register 150.

Thereafter, the higher-bit register 130 stores the internal data bit IB1 or IB2 in response to the first or second higher read-control signal DLOAD or nDLOAD, and the input data bit ID is received through the input/output node IO (step 520). In more detail, during a period P2 (i.e., a data loading period), the input control signal DIN and the first or second higher read-control signal DLOAD or nDLOAD are enabled. The data input circuit 180 connects the input/output node IO to the data input/output node Y1 in response to the input control signal DIN. As the data input/output node Y1 is set to the level of the ground voltage VSS while loading a data bit by the higher-bit register 130, the data input circuit 180 outputs the input data bit of logical '0' to the input/output node IO from the data input/output node Y1. During this, if the first higher read-control signal DLOAD is being enabled, the switching circuit 134 of the input circuit 132 is turned on to connect the input/output node IO with the node Q1. As a result, the input data bit ID is transferred to the node Q1 so that the internal data bit IB1 of logical '0' appears at the node Q1 and the latch circuit 133 holds the internal data bit IB1 therein. Further, if the second higher read-control signal nDLOAD is being enabled, the switching circuit of the input circuit 132 is turned on to connect the input/output node IO with the node Q2. As a result, the input data bit ID is transferred to the node Q2, generating the internal data bit IB2 of logical '0' at the node Q2. The output drive circuit 140 inverses the internal data bit IB1 or IB2 of the node Q1.

Thereafter when the program control signal PGML is being enabled during a period P4, the transmission circuit 160 transfers the internal data bit IB1 or IB2 from the higher-bit register 130 to the lower-bit register 150 by way of the sensing node SO in response to the program control signal PGML (step 530). When the program control signal PGML is being enabled, the first lower read-control signal READ1 is activated. Responding to the first lower read-control signal, the lower-bit register 150 detects a voltage of the sensing node SO, which is determined by the internal data bit IB1 or IB2, and stores the first lower sensing data bit SB3 according to reset of the detection (step 540). Meanwhile, when the internal data bit IB1 or IB2 is a logical '0', the lower-bit register 150 maintains its initialization state of the period P1.

During a period P5, a lower data bit is read out from the selected multi-level cell Me11 (i.e., a cell to be programmed) connected to a selected bitline (e.g., BLe1) and a selected wordline (e.g., WL1) (step 550). In further detail, when the precharge control signal PRECHb is being disabled during the period P5, the precharging circuit 120 charges the sensing node SO up to the level of the internal voltage VCC in response to the precharge control signal PRECHb. A verifying voltage PV1 is applied to the selected wordline WL1 and a read voltage VREAD is applied to the deselected wordlines (e.g., WL2~WLJ), the drain selection line DSL, and the source selection line SSL. Referring to FIG. 3, the read voltage VREAD is higher than the verifying voltage PV1. The verifying voltage PV1 is higher than a threshold voltage of a multi-level cell (i.e., a multi-level cell storing the data state '11') and lower than a threshold voltage of a multi-level cell storing the data state '10'. As a result, the lower data bit RLD1 is output to the sensing node SO from the multi-level cell Me11, which is to be programmed, being connected to the selected bitline BLe1. For example, if the multi-level cell Me11 to be programmed stores the data state '11', the multi-level cell Me11 is turned on to output the lower data bit RLD1 of logical '0' to the sensing node SO. And, if the multi-level cell Me11 to be programmed stores the other states but '11', i.e., '10', '00', or '01', it is turned off to output the lower data bit RLD1 of logical '1' to the sensing node SO.

When the first lower read-control signal READ1 is being enabled, the lower-bit register 150 detects a voltage at the sensing node SO, which is determined by the lower data bit RLD1, and stores a second lower sensing data bit SB3' according to a result of the detection. For instance, if the lower data bit RLD1 is a logical '1', the lower-bit register 150 stores the second lower sensing data bit SB3' in logical '0'. And, if the lower data bit RLD1 is a logical '0', the lower-bit register 150 maintains the storage state of the period P4.

Thereafter, in a period P6, the verifying circuit 210 generates a lower verifying data bit VRFR in response to the second lower sensing data bit SR3' (step 570). Preferably, when the second lower sensing data bit SB3b' (or the lower sensing data bit SB4) is a logically low level, the verifying circuit 210 outputs the lower verifying data bit VRFR with a logically high level. The verifying circuit 210 determines whether a logical value of the lower verifying data bit VRFR is an established value (i.e., a logical '0') or not (step 580). If the logical value of the lower verifying data bit VRFR is identical to the established value, step 500 is terminated. If the logical value of the lower verifying data bit VRFR is different from the established value, the transmission circuit 170 transfers the second lower sensing data bit SB3b' (or the lower sensing data bit SB4) to the selected bitline BLe1 through the sensing node SO in response to the program control signal PGMR, while the program control signal VPGMR is being supplied to the selected wordline WL1 during a period P7 (step 590). As a result, the multi-level cell Me11 is programmed. Thereafter, steps 550 through 580 are repeated. Meanwhile, after a first programming cycle including the steps 550~580, the program voltage VPGM, raised by a stepping voltage (not shown), is supplied to the selected wordline WL1 at every execution of step 590 in the programming cycles.

Next, a procedure of programming a data bit by the page buffer circuit in accordance with another embodiment of the present invention will be described in detail with reference to FIGS. 16 and 17. For the convenience of explanation, in this embodiment, the programming of the multi-level cells Me11~Me1N of the page PG1 will be used as an example. This embodiment will be exemplarily described with an operation of the page buffer circuit PB1.

Figure 16:
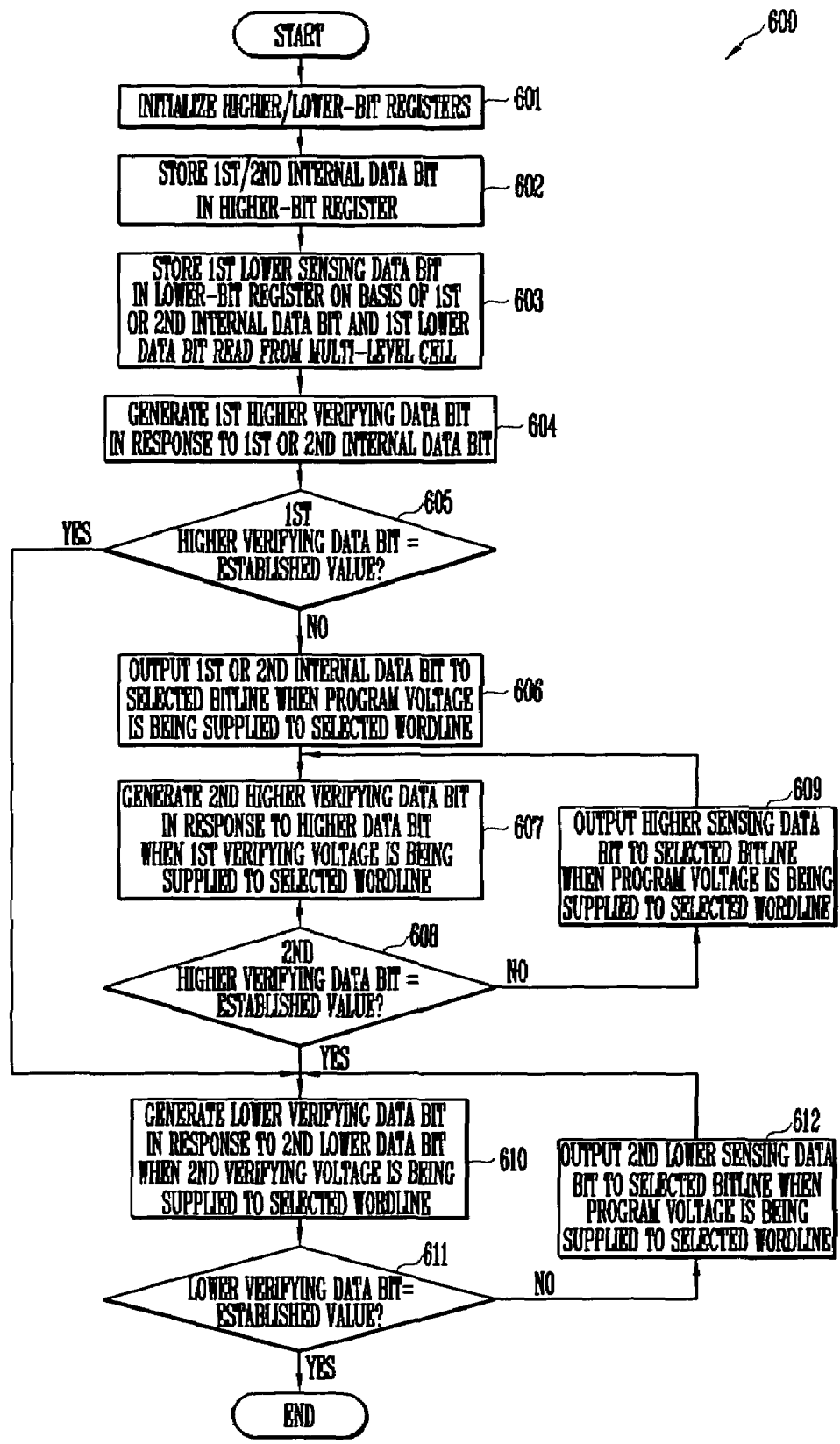
FIG. 16 is a flow chart showing the procedure of a programming operation by the page buffer circuit according to another embodiment of the present invention.
Figure 17:
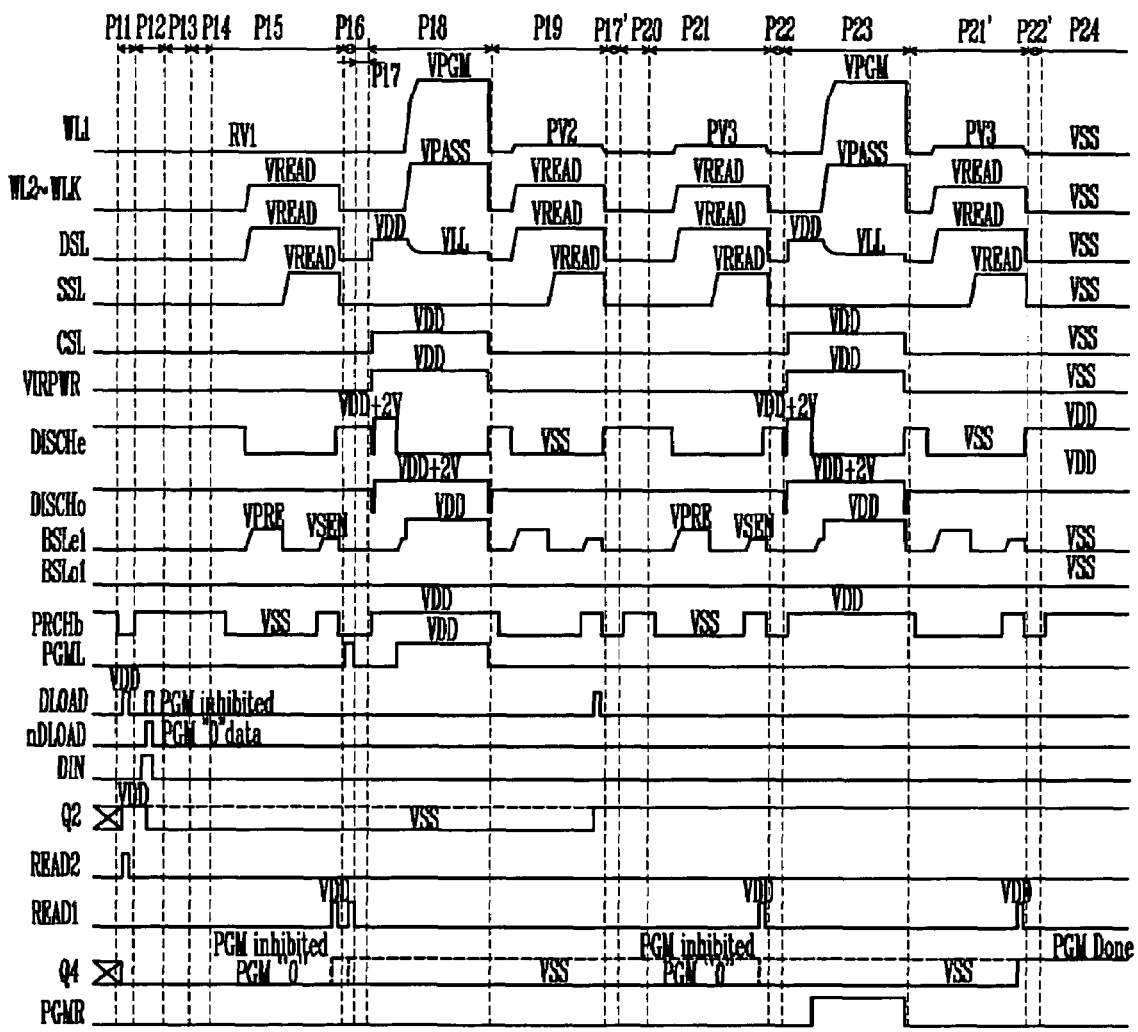
FIG. 17 is a timing diagram of signals associated with the programming operation by the page buffer circuit in accordance with another embodiment of the present invention.

FIG. 16 is a flow chart showing the procedure of a programming operation by the page buffer circuit according to the another embodiment of the present invention, which illustrates processing steps by the page buffer circuit PB1 for programming a higher data bit into a selected multi-level cell. Referring to FIG. 16, the higher-bit register 130 and the lower-bit register 150 are initialized during an initializing period P11 (step 601). During a data loading period P12, the higher-bit register 130 stores the internal data bit IB1 or IB2 (step 602). Operations of the page buffer circuit PB1 in the periods P11 and P12 are substantially identical to those in the aforementioned periods P1 and P2, so it will not be described in further detail.

Thereafter, in periods P15 and P16, the lower-bit register 150 stores the first lower sensing data bit SB3 on the basis of the internal data bit IB1 or IB2 and the first lower data bit RLD1 that is read out from the selected multi-level cell (i.e., a multi-level cell to be programmed) connected to the selected wordline WL1 and the selected bitline BLe1 (step 603).

The step 603 is explained in more detail hereinafter. In the period P15, the lower-bit register 150 detects a voltage of the sensing node SO which is determined by the first lower data bit RLD1 output from the selected multi-level cell Me11 and stores the first sensing data bit SB3' according to a result of the detection, when the read voltage RV1 is being supplied to the selected wordline WL1, in response to the first lower read-control signal READ1. In the period P15, the operation of the page buffer circuit PB1 is similar to that in the aforementioned period P5, except that the read voltage is supplied to the selected wordline WL1, so it will not be described in more detail. Thereafter, when the program control signal PGML is being enabled in the period P16, the transmission circuit 160 transfers the internal data bit IB1b or IB2, which is stored in the higher-bit register 130, to the lower-bit register 150 in response to the program control signal PGML. When the first lower read-control signal READ1 is being enabled in the period P16, the lower-bit register 150 detects a voltage of the sensing node SO, which is determined by the internal data bit IB1b or IB2, and stores a second sensing data bit SB3" as the first lower sensing data bit in accordance with a result of the detection.

Next, during the period P17, the verifying circuit 200 generates a first higher verifying data bit VRFL in response to the internal data bit IB1b or IB2 that is received from the node Q2 (step 604). The verifying circuit 200 determines whether a logical value of the higher verifying data bit VRFL is an established value (i.e., a logical '0') or not (step 605). If the logical value of the higher verifying data bit VRFL is different from the established value, the program control signal PGML is enabled. Responding to the activation of the program control signal PGML, the transmission circuit 160 transfers the internal data bit IB1b or IB2 to the selected bitline BLe1 through the sensing node SO (step 606). As a result, the multi-level cell Me11 is programmed.

Thereafter, in a period P19, as the verifying voltage PV2 is being supplied to the selected wordline WL1, the verifying circuit 200 generates a second higher verifying data bit VRFL' in response to the higher data bit RMD read out from the selected multi-level cell Me11 (step 607). In further detail, during the period P19, the verifying voltage PY2 is supplied to the selected wordline WL1 and the read voltage VREAD is applied to the deselected wordlines WL2~WLJ, the drain selection line DSL, and the source selection line SSL. Referring to FIG. 3, the verifying voltage PV2 is higher than the read voltage RV2 and lower than a threshold voltage of a multi-level cell storing the data state '00'. The sensing node SO receives the higher data bit RMD read out from the multi-level cell Me11, to be programmed, which is connected to the selected bitline BLe1 and the selected wordline WL1. During this time, if the multi-level cell Me11 to be programmed stores the data state '10' or '11', the multi-level cell Me11 to be programmed is turned on to output the higher data bit RMD of logical '1' to the sensing node SO. If the multi-level cell Me11 to be programmed stores the data state '00' or '01', the multi-level cell Me11 to be programmed is turned off to output the higher data bit RMD of logical '0' to the sensing node SO. When the first higher read-control signal DLOAD is being enabled, the higher-bit register 130 detects a voltage of the sensing node SO and stores the higher sensing data bit SB1 according to a result of the detection, in response to the first higher read-control signal DLOAD. For example, when the higher data bit RMD is a logical '1', the higher-bit register 130 stores the higher sensing data bit SB1 of logical '0'. When the higher data bit RMD is a logical '0', the higher-bit register 130 maintains the storage state of the period P12. Thereafter, in a verifying period P17', the verifying circuit 200 generates the second higher verifying data bit VRFL' in response to the higher sensing data bit SB1. Preferably, when the higher sensing data bit SB1 is being set on a logically low level, the verifying circuit 200 generates the second higher verifying data bit VRFL' of a logically high level.

Moreover, in the period P17', it determines whether a logical value of the second higher verifying data bit VRFL' is an established value (i.e., a logical '0') or not (step 608). If the logical value of the second higher verifying data bit VRFL' is different from the established value, the program control signal PGML is enabled when the program voltage VPGM is being supplied to the selected wordline WL1 in a period P18. Responding to the activation of the program control signal PGML, the transmission circuit 160 transfers the internal data bit IB1b or IB2 to the selected bitline BLe1 through the sensing node SO (step 609). As a result, the multi-level cell Me11 is programmed with the internal data bit IB1b or IB2. Thereafter, the steps 606 through 609 are repeated. Meanwhile, after a first programming cycle including the steps 606~609, the program voltage VPGM, raised by a stepping voltage (not shown), is supplied to the selected wordline WL1 at every execution of step 609 in the programming cycles.

Meanwhile, if the first higher verifying data bit VRFL matches with the established value in the step 605, or if the first higher verifying data bit VRFL' matches with the established value in the step 608, a step 610 is carried out. In the step 610, as a verifying voltage PV3 is being supplied to the selected wordline WL1, the verifying circuit 210 generates the lower verifying data bit VRFR in response to a second lower data bit RLD2 read out from the selected multi-level cell Me11. In more detail, during a period P21, the verifying voltage PY3 is supplied to the selected wordline WL1 and the read voltage VREAD is applied to the deselected wordlines WL2~WLJ, the drain selection line DSL, and the source selection line SSL. Referring to FIG. 3, the verifying voltage PV3 is higher than the verifying voltage PV2 and lower than a threshold voltage of a multi-level cell storing the data state '01'. The sensing node SO receives the lower data bit RLD2 read out from the multi-level cell Me11 to be programmed, which is connected to the selected bitline BLe1 and the selected wordline WL1. During this, if the multi-level cell Me11 to be programmed stores one of the data states '11', '10', and '00', the multi-level cell Me11 to be programmed is turned on to output the lower data bit RLD2 of logical '0' to the sensing node SO. If the multi-level cell Me11 to be programmed stores the data state '01', the multi-level cell Me11 to be programmed is turned off to output the lower data bit RLD2 of logical '1' to the sensing node SO.

When the first lower read-control signal READ1 is being enabled, the lower-bit register 150 detects a voltage of the sensing node SO and stores a lower sensing data bit SB3''' according to a result of the detection, in response to the first lower read-control signal READ1. For example, when the lower data bit RLD2 is a logical '1', the lower-bit register 150 stores the lower sensing data bit SB3''' of logical '0'. When the lower data bit RLD2 is a logical '0', the lower-bit register 150 maintains the storage state of the period P16. The verifying circuit 210 generates the lower verifying data bit VRFR with a logical '1' when the second lower sensing data bit SB3$b$''' is a logical '0'. Otherwise, the verifying circuit 210 generates the lower verifying data bit VRFR with a logical '0' when the second lower sensing data bit SB3$b$''' is a logical '1'.

After then, in the period P22, the verifying circuit 210 determines whether a logical value of the lower verifying data bit VRFR is an established value (i.e., a logical '0') or not (step 611). If the logical value of the lower verifying data bit VRFR is matched with the established value, step 600 is terminated. If the logical value of the lower verifying data bit VRFR is different from the established value, the program control signal PGMR is enabled when the program voltage VPGM is being supplied to the selected wordline WL1 during a period P23. Responding to the activation of the program control signal PGMR, the transmission circuit 170 transfers the second lower sensing data bit SB3$b$''' to the selected bitline BLe1 through the sensing node SO (step 612). As a result, the multi-level cell Me11 is programmed. Thereafter, the steps 610 through 612 are repeated. Meanwhile, after a first programming cycle including the steps 610~612, the program voltage VPGM, raised by a stepping voltage (not shown), is supplied to the selected wordline WL1 at every execution of step 612 in the programming cycles.

As aforementioned, the page buffer circuit according to the present invention is able to read a data bit by alternatively using the higher-bit register or the lower-bit register, regardless of whether the data bit read out from the multi-level cell is a higher data bit or a lower data bit, in a read operation.

In addition, the page buffer circuit according to the present invention is able to conduct reading and programming operations with a simplified structure, which reduces a circuit area thereof and improves the operation performance.

Moreover, the page buffer circuit according to the present invention is able to execute reading and programming operations for a single-level cell.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A flash memory device, comprising:
   a memory cell array including a plurality of multi-level cells, each cell being configured to store at least two bits of data and coupled to at least a bitline; and
   a page buffer circuit coupled to the memory cell array and including:
   a higher-bit register to detect a voltage of a sensing node, and store a first or second higher sensing data bit according to a result of the detection in response to a first or second higher read-control signal, and store a first or second internal data bit in response to the first or second higher read-control signal and an input data bit received through an input/output node;
   an output drive circuit to generate an output data bit in response to one of the first higher sensing data bit, the second higher sensing data bit, the first internal data bit, and the second internal data bit;
   a lower-bit register to detect a voltage of the sensing node and storing a first or second lower sensing data bit according to a result of the detecting in response to a first or second lower read-control signal;
   a first transmission circuit to transmit the output data bit to the sensing node in response to a first program control signal; and
   a second transmission circuit to transmit the first or second lower sensing data bit to the sensing node in response to a second program control signal.

2. The device of claim 1, wherein the page buffer circuit further comprises:
   a data input circuit to output the input data bit to the input/output node in response to an input control signal;
   a data output circuit to output the output data bit to an data input/output node in response to an output control signal;
   a bitline selection circuit to select one of a bitline pair and couple the selected bitline with the sensing node in response to bitline selection signals and discharge signals;
   a precharge circuit to precharge the sensing node to an internal voltage in response to a precharge control signal;
   a first verifying circuit to output a higher verifying data bit in response to a received one of the first and second higher sensing data bits; and
   a second verifying circuit to output a lower verifying data bit in response to a received one of the first and second lower sensing data bits.

3. The device of claim 2, wherein the higher-bit register comprises:
   a sensing circuit to detect a voltage of the sensing node and generate a sensing data bit to the input/output node according to a result of the detection;
   an input circuit to output the first higher sensing data bit or the first internal data bit to a first node in response to the first higher read-control signal and the sensing data bit or the input data bit which is received through the input/output node, or output the second higher sensing data bit or the second internal data bit to a second node in response to the second higher read-control signal and the sensing data bit or the input data bit which is received through the input/output node; and
   a latch circuit to latch the first internal data bit or the first higher sensing data bit received through the first node and output an inverse of the first higher sensing data bit or an inverse of the first internal data bit to the second node, or latch the second internal data bit or the second higher sensing data bit received through the second node and output an inverse of the second higher sensing data bit or an inverse of the second internal data bit to the first node.

4. The device of claim 3, wherein the sensing circuit discharges the input/output node to a ground voltage level in accordance with a voltage level of the sensing node,
   wherein the input circuit comprises:
   a first switching circuit provided between the first node and the input/output node and configured to be turned on or off in response to the first higher read-control signal; and a second switching circuit provided between the second node and the input/output node and configured to be turned on or off in response to the second higher read-control signal.

5. The device of claim 3, wherein the output drive circuit comprises a first inverter coupled to the first node and inverses at least one of the first higher sensing data bit, the inverse of the second higher sensing data bit, the first internal data bit, and the inverse of the second internal data bit, wherein the latch circuit comprises second inverters cross-coupled with input and output terminals to the first and second nodes, wherein the first inverter is larger than each of the second inverters in current drivability.

6. The device of claim 3, wherein during a read operation, the sensing circuit is configured to detect a voltage of the sensing node which is determined by a higher or lower data bit read out from one of the plural multi-level cell coupled to the selected bitline or by the first or second lower sensing data bit.

7. The device of claim 2, wherein the lower-bit register comprises:

a sensing circuit to detect a voltage of the sensing node and generate the first lower sensing data bit to a first node in response to the first lower read-control signal, or detect a voltage of the sensing node and generate the second lower sensing data bit to a second node, in response to the second lower read-control signal; and a latch circuit to latch the first lower sensing data bit received through the first node and output an inverse of the first lower sensing data bit to the second node, or latch the second lower sensing data bit received through the second node and output an inverse of the second lower sensing data bit to the first node.

8. The device of claim 7, wherein the sensing circuit is configured to detect a voltage of the sensing node which is determined by a lower or higher data bit read out from one of the plural multi-level cells coupled to the selected bitline during a read operation, and detect a voltage of the sensing node which is determined by the lower data bit or the output data bit.

9. The device of claim 2, wherein the data input circuit comprises a first switching circuit provided between the input/output node and the data input/output node and is configured to be turned on or off in response to the input control signal, wherein the data output circuit comprises a second switching circuit provided between an output terminal of the output drive circuit and the data input/output node and is configured to be turned on or off in response to the output control signal.

* * * * *